(12) United States Patent
Dinc et al.

(10) Patent No.: US 11,171,636 B2
(45) Date of Patent: Nov. 9, 2021

(54) METHODS AND APPARATUS FOR PHASE IMBALANCE CORRECTION

(71) Applicant: Texas Instruments Incorporated, Dallas, TX (US)

(72) Inventors: Tolga Dinc, Dallas, TX (US); Salvatore Luciano Finocchiaro, Dallas, TX (US); Gerd Schuppener, Allen, TX (US); Siraj Akhtar, Richardson, TX (US); Swaminathan Sankaran, Allen, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/585,155

(22) Filed: Sep. 27, 2019

(65) Prior Publication Data

US 2020/0212899 A1 Jul. 2, 2020

Related U.S. Application Data

(63) Continuation of application No. 16/235,669, filed on Dec. 28, 2018, now Pat. No. 10,491,198.

(51) Int. Cl.
*H03K 5/02* (2006.01)
*H03K 5/26* (2006.01)
*G01R 25/04* (2006.01)
*H03H 7/01* (2006.01)
*H03K 5/00* (2006.01)

(52) U.S. Cl.
CPC .............. *H03K 5/02* (2013.01); *G01R 25/04* (2013.01); *H03H 7/0115* (2013.01); *H03K 5/26* (2013.01); *H03K 2005/00286* (2013.01)

(58) Field of Classification Search
None
See application file for complete search history.

(56) References Cited

U.S. PATENT DOCUMENTS

| | | | |
|---|---|---|---|
| 6,404,293 B1 * | 6/2002 | Darabi | H03B 21/01 331/37 |
| 7,016,664 B2 * | 3/2006 | Souetinov | H03D 7/1441 327/214 |
| 8,073,078 B2 * | 12/2011 | Kaczman | H04L 27/3872 330/250 |
| 8,385,852 B2 | 2/2013 | Lozhkin | |
| 9,929,885 B2 * | 3/2018 | Purushothaman | H03D 3/242 |
| 10,326,584 B2 * | 6/2019 | Chen | H04L 7/0041 |

OTHER PUBLICATIONS

Prosecution History, U.S. Appl. No. 16/235,669, filed Dec. 28, 2018, 119 pages.

* cited by examiner

*Primary Examiner* — Jeffrey S Zweizig
(74) *Attorney, Agent, or Firm* — Michelle F. Murray; Charles A. Brill; Frank D. Cimino

(57) ABSTRACT

Methods, apparatus, systems and articles of manufacture are disclosed to provide phase imbalance correction. An example system includes a phase detector to obtain a first signal and generate a first output, a comparator coupled to the phase detector, the comparator to generate a second output based on the first output, and an amplifier coupled to the comparator, the amplifier to adjust a first phase response of the first signal based on the second output.

19 Claims, 8 Drawing Sheets

METHODS AND APPARATUS FOR PHASE IMBALANCE CORRECTION

CROSS-REFERENCE TO RELATED APPLICATION AND PRIORITY CLAIM

This application is a continuation application, which also claims priority to U.S. patent application Ser. No. 16/235,669, filed Dec. 28, 2018. This provisional patent application is hereby incorporated by reference in its entirety.

FIELD OF THE DISCLOSURE

This disclosure relates generally to signal transmission and reception, and, more particularly, to a methods and apparatus for phase imbalance correction.

BACKGROUND

Traditional methods of sending data and/or signals include a transmitter and/or a receiver. In certain applications, the transmitter broadcasts data in the form of an analog signal and the receiver obtains the analog signal and converts the analog signal to digital data (e.g., analog to digital conversion). The signals transmitted and/or received by a transmitter and/or receiver are often modulated to efficiently transfer data for use in electronic devices. The data and/or signals used by an electronic device may be further modulated and/or demodulated to suit the characteristics of the electronic device.

SUMMARY

An example system includes a phase detector to obtain a first signal and generate a first output, a comparator coupled to the phase detector, the comparator to generate a second output based on the first output, and an amplifier coupled to the comparator, the amplifier to adjust a first phase response of the first signal based on the second output.

BRIEF DESCRIPTION OF THE DRAWINGS

The figures are not to scale. Instead, the thickness of the layers or regions may be enlarged in the drawings. In general, the same reference numbers will be used throughout the drawing(s) and accompanying written description to refer to the same or like parts.

DETAILED DESCRIPTION

Figure 1:
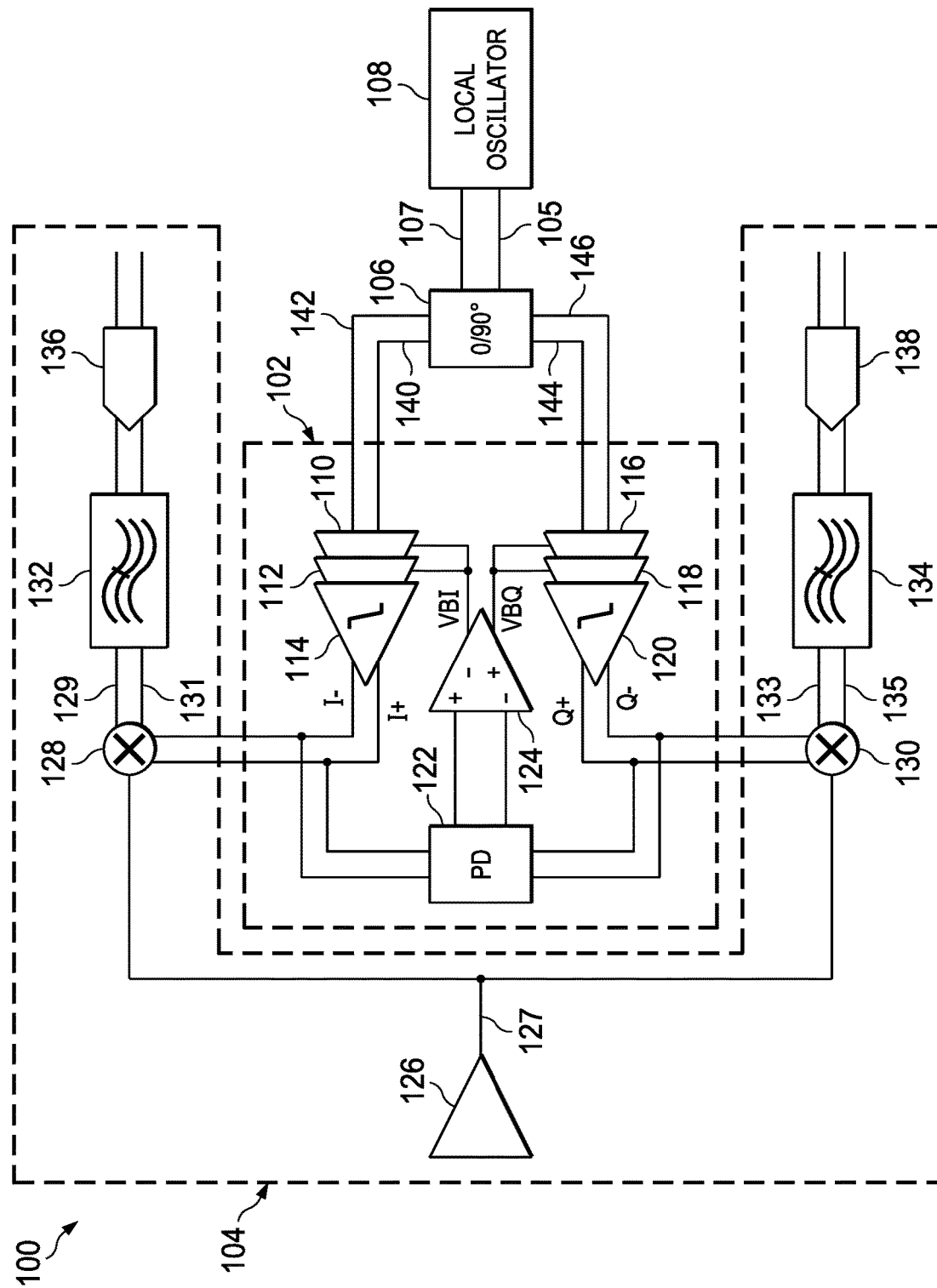
FIG. 1 is a block diagram of a system including a continuous phase corrector coupled to a receiver.

Transmitters and/or receivers are used in signal transmission and/or reception to relay signals for use in communication, radio, radar, and/or any other suitable application. Transmitters and/or receivers modulate signals to efficiently transfer data for use in the electronic devices. Example modulation techniques include analog modulation or digital modulation. Example analog modulation techniques include amplitude modulation, frequency modulation, phase modulation, or a combination of these. Example digital modulation techniques include phase-shift keying (PSK), frequency-shift keying (FSK), amplitude-shift keying (ASK), or quadrature amplitude modulation (QAM). Modulation facilitates data transmission under a specific range of constraints (e.g., within a certain frequency band, within a certain amplitude range, etc.). Typically, modulation is performed to input information on a signal for transmission, and demodulation is performed on a received signal to obtain information therefrom. Modulation and/or demodulation is performed to generate a signal suited to the constraints of a transmission channel.

In addition to modulation and/or demodulation, techniques involved in transmission and/or reception may involve utilizing a carrier signal to increase signal strength, vary the phase, vary the frequency, or any other suitable means. The carrier signal may be an oscillating signal. The oscillating signal, herein referred to as a local oscillating signal (LO), is used to control the frequency of the transmission and/or reception signal. The transmitter and/or receiver may modulate the carrier signal (e.g., apply analog modulation or digital modulation) for use by varying electrical components in the transmitter and/or receiver. When modulation is performed, inconsistencies such as amplitude mismatches and/or phase mismatches often occur. For example, when a receiver performs QAM on a local oscillating signal, the phase of the resulting modulated local oscillating signal may not be the desired phase. The phase mismatch between the desired local oscillator signal and the modulated local oscillator signal creates inefficiencies in the transmitter and/or receiver (e.g., loss of power, loss of data, etc.).

Examples disclosed herein facilitate the detection and correction of phase mismatches in a local oscillating signal. In examples disclosed herein, phase mismatches may be corrected before reaching the transmitter and/or receiver. When quadrature amplitude modulation is performed on differential local oscillating signals (e.g., complimentary local oscillating signals), the differential local oscillating signals have a desired phase difference of 90-degrees. In examples disclosed herein, the amplitude of the local oscillating signal, or any other signal, may be adjusted to correct phase mismatches. Other examples disclosed herein include correcting a phase mismatch for a desired phase difference of any numerical value other than 90-degrees (e.g., a desired phase difference of 45-degrees).

Examples disclosed herein are utilized during quadrature amplitude modulation (QAM). QAM utilizes two carrier signals: an in-phase carrier signal and a quadrature carrier signal. Ideally, the in-phase carrier signal (in-phase signal or I) is exactly 90-degrees separated from the quadrature carrier signal (quadrature signal or Q). In reality, the I and Q signals are not exactly 90 degrees out of phase due to non-ideal components, signal loss, errors resulting from I/Q generation, etc.

Additionally, examples disclosed herein are not limited to detecting and correcting phase mismatches resulting from quadrature amplitude modulation. More specifically, other example modulation and/or demodulation techniques include phase-shift keying (PSK), frequency-shift keying (FSK), amplitude-shift keying (ASK), etc. Examples disclosed herein may detect and correct a phase difference between any two signals with any pre-determined phase difference that may occur from the above-mentioned modulation and/or demodulation techniques. For example, if the desired phase difference between two signals is 45 degrees, examples disclosed herein may detect and correct for the desired 45-degree phase difference. In this scenario, the two signals may hereinafter be referred to as an in-phase signal and out-of-phase signal. Additionally, examples disclosed herein allow for improvements to signal transmission in which QAM is not utilized, such as a reduction of power loss and/or a reduction of data loss. Regardless of the modulation technique preformed, examples disclosed herein facilitate continuous phase imbalance correction between two signals.

Examples disclosed herein include a symmetric phase detector that can continuously detect and calibrate phase mismatches, imbalances, etc., at any frequencies during operation. Furthermore, examples disclosed herein include generating a discrete-time output and/or a continuous-time output to calibrate phase mismatches, imbalances, etc., by adjusting a phase response of signals.

Examples disclosed herein include a continuous phase corrector coupled to a receiver in a closed loop topology, such that the connection to the receiver can remain closed (e.g., connected) throughout operation. For example, the continuous phase corrector monitors and/or corrects phase imbalance existing between in-phase signals and quadrature signals without disrupting the operation of the receiver or any other suitable component.

FIG. 1 is a block diagram of a system 100 including a continuous phase corrector 102 coupled to a receiver 104. Alternatively, the continuous phase corrector 102 may be coupled to a transmitter or any other device to interpret at least two signals. The output of an example in-phase and quadrature signal generator 106 (hereinafter I/Q generator 106) is coupled to the continuous phase corrector 102. In this example, the I/Q generator 106 creates differential in-phase signals (lines 140, 142) that are 90-degrees out of phase with the differential quadrature signals (lines 144, 146). The continuous phase corrector 102 is coupled to the receiver 104 in a continuous feedback loop. In this topology, the continuous phase corrector 102 detects and corrects phase mismatches without interruption to the example receiver 104. The in-phase signals (lines 140, 142) and quadrature signals (lines 144, 146) that are mixed with the received signal from the receiver 104 are continuously corrected so the desired phase difference is achieved (e.g., desired 90-degree phase difference).

The example continuous phase corrector 102 provides appropriate amplification to the local oscillating signals (e.g., the in-phase signals (lines 140, 142) and the quadrature signals (lines 144, and 146)), while simultaneously correcting unwanted phase imbalance. In some examples disclosed herein, the continuous phase corrector 102 may operate discretely (e.g., in discrete-time, periodic-time and/or aperiodic intervals of time). The continuous phase corrector 102 includes example amplifiers 110, 112, and 114 coupled to the in-phase signals (lines 140, 142) from the I/Q generator 106 and example amplifiers 116, 118, and 120 coupled to the quadrature signals (lines 144, 146) from the I/Q generator 106. A phase detector 122 is coupled to the output of the amplifier 114 and the output of the amplifier 120. An example comparator 124 is coupled to the output of the phase detector 122. Additionally, the comparator 124 is coupled to the inputs of the in-phase amplifiers 110, 112 and the inputs of the quadrature amplifiers 116, 118. The continuous phase corrector 102 is coupled to both the mixers 128, 130 of the receiver 104 and the I/Q generator 106. In examples disclosed herein, the continuous phase corrector 102 monitors and/or corrects phase imbalance existing between in-phase signals (lines 140, 142) and quadrature signals (lines 144, 146) without disrupting the operation of the receiver 104 or any other suitable component.

The example receiver 104 of FIG. 1 includes a receiver amplifier 126, mixers 128, 130, signal filters 132, 134, and converters 136, 138. The mixers 128 and 130 are coupled to the output of the amplifiers 114 and 120 respectively. Examples disclosed herein include continuously correcting phase differences between the in-phase signals (lines 140, 142) and quadrature signals (lines 144, 146) generated by the I/Q generator 106 before the signals (e.g., the in-phase signals (lines 140,142) and quadrature signals (lines 144, 146)) are transmitted to the receiver 104. The continuous phase corrector 102 may be implemented within the receiver 104 of FIG. 1, a transmitter, externally in a separate device, and/or any other suitable device. The continuous phase corrector 102 may be implemented with a network of devices, as a single device, or as a circuit. Examples disclosed herein include signal phase calibration using phase detector 122, amplifiers 110, 112, 116, and 118 and a comparator. Alternatively, signal calibration may be done with the use of other components such as filters.

The example I/Q generator 106 receives a high frequency signal, for example a signal having a frequency of 125 gigahertz (GHz) and generates the in-phase signals (lines 140, 142) and quadrature signals (lines 144, and 146), (e.g., I+, I−, Q+, and Q−, respectively). The input of the I/Q generator 106 may be a carrier signal (e.g., a local oscillating signal). In some examples disclosed herein, the I/Q generator 106 may be implemented using a hybrid coupler. In such examples, the desired phase difference between the in-phase signals (lines 140, 142) and quadrature signals (lines 144, 146) is 90 degrees. In the example depicted in FIG. 1, the local oscillator 108 generates differential signals and, thus, the output of the I/Q generator 106 is four signals (e.g., differential in-phase signals (lines 140, 142) and differential quadrature signals (lines 144, 146)). The I/Q generator 106 generates differential signals for each differential signal from the local oscillator 108. For example, the differential in-phase signals (lines 140, 142) may include desired phases of 0 degrees and 180 degrees, and the differential quadrature signals (lines 144, 146) may include desired phases of 90 degrees and 270 degrees. In such case, the signals are in quadrature (e.g., 90-degree phase difference). In examples disclosed herein, the in-phase signals (lines 140, 142) include a reference phase, where the quadrature signals (lines 144, 146) are 90 degrees shifted in phase from the reference phase. For example, the in-phase signals (lines 140, 142) may include desired phases of 15 degrees and 195 degrees, and the differential quadrature signals (lines 144, 146) may include desired phases of 105 degrees and 285 degrees. Additionally, example in-phase signals (lines 140, 142) and/or example quadrature signals (lines 144, 146) may be millimeter wave signals (e.g., having a frequency ranging from 30 GHz to 300 GHz). In some examples disclosed herein, the in-phase signals (lines 140, 142) and/or quadrature signals (lines 144, 146) can be generated at any frequency (e.g., radio frequency). The desired phase difference between the in-phase signals (lines 140, 142) and the quadrature signals (lines 144, 146) may be generated with a propagation delay or any other phase delay method.

The example local oscillator 108 creates an oscillating signal for the I/Q generator 106. The signals (e.g., lines 105, 107) created by the local oscillator 108 are millimeter wave signals (e.g., having a frequency ranging from 30 GHz to 300 GHz). In the example illustrated in FIG. 1, the local oscillator 108 creates a differential signal (e.g., a signal including two components, lines 105, 107) for use by the I/Q generator 106. In some examples disclosed herein, the local oscillator 108 may create an oscillating signal at any frequency (e.g., radio frequency). The local oscillator 108 may be implemented utilizing a crystal oscillator, variable frequency oscillator, frequency synthesizer, or any other suitable method of implementing the local oscillator 108.

The example in-phase amplifiers 110 and 112 apply a gain to the in-phase signals (e.g., lines 140, 142). The in-phase amplifiers 110 and 112 may apply the gain to the in-phase signals (e.g., 140, 142) to adjust a phase response between the input signal phase of the in-phase amplifiers 110, 112 and the resulting output signal phase of the in-phase amplifiers 110, 112. Additionally, the in-phase amplifiers 110 and 112 may apply the gain to the in-phase signal (e.g., lines 140, 142) to adjust the phase response in multiple stages. The in-phase amplifiers 110 and 112 may be tuned with a variable gain. In this case, the in-phase amplifiers 110 and 112 apply the variable gain to the in-phase signals (lines 140, 142) to adjust the phase response of the output signal of the in-phase amplifiers 110, 112 to produce a different phase output.

The example amplifier 114 is a limiting amplifier. The amplifier 114 limits the amplitude of the in-phase signals (lines 140, 142). When tuning the in-phase amplifiers 110 and 112 (e.g., adjusting the gain), the amplitude imbalance limit may be exceeded. In such case, the amplifier 114 limits the amplitude of the in-phase signals (lines 140, 142) to remain within a desired constraint. Other examples include a single amplifier in place of the three illustrated amplifiers 110, 112, and 114 of FIG. 1. In this case, the single amplifier may apply an appropriate gain to the in-phase signals (lines 140, 142) and limit the amplitude as well. The amplifiers 110, 112 may also apply a gain to the in-phase signals (lines 140, 142) which is equal in magnitude and opposite in polarity to another gain applied to the quadrature signals (lines 144, 146) by the amplifiers 116 and 118. Alternatively, there may be any number of amplifiers in place of the amplifiers 110, 112, and 114. The amplifiers 110, 112, and/or 114 may be amplitude amplifiers, or any other type of amplifier.

The example quadrature amplifiers 116 and 118 apply a gain to the quadrature signals (e.g., lines 144, 144). The quadrature amplifiers 116 and 118 may apply the gain to the quadrature signals (e.g., 144, 146) to adjust a phase response between the input signal phase of the quadrature amplifiers 116, 118 and the resulting output signal phase of the quadrature amplifiers 116, 118. Additionally, the quadrature amplifiers 116 and 118 may apply the gain to the quadrature signals (e.g., 144, 146) to adjust the phase response in multiple stages. The quadrature amplifiers 116 and 118 may be tuned with a variable gain. In this case, the quadrature amplifiers 116 and 118 apply the variable gain to the quadrature signals (lines 144, 146) to adjust the phase response of the output signals of the quadrature amplifiers 116, 118 and produce a different phase output.

The amplifier 120 is a limiting amplifier. The amplifier 120 limits the amplitude of the quadrature signals (lines 144, 146). When tuning the quadrature amplifiers 116 and 118, the amplitude imbalance limit may be exceeded. In this case, the amplifier 120 limits the amplitude of the quadrature signals (lines 144, 146) to remain within a desired constraint. Other examples include a single amplifier in place of the three amplifiers 116, 118, and 120. In this case, the single amplifier may apply an appropriate gain to the quadrature signals (lines 144, 146) and limit the amplitude as well. Alternatively, there may be any number of amplifiers in place of the amplifiers 116, 118, and 120. The amplifiers 116, 118, and/or 120 may be amplitude amplifiers, or any other type of amplifier.

The example phase detector 122 detects the phase difference between the in-phase signals (lines 140, 142) and the quadrature signals (lines 144, 146). The output of the phase detector 122 is a differential voltage representative of the phase difference between the in-phase signals (lines 140, 142) and the quadrature signals (lines 144, 146). In this example, there exists a differential (e.g., two component) in-phase signal (lines 140, 142) and a differential (e.g., two component) quadrature signal (lines 144, 146). Thus, the phase detector 122 determines the phase difference between the corresponding signal components. In other implementations, the phase detector may receive non-differential components, and thus, detect a phase difference between single components. Additionally, the phase detector 122 may output any other metric (e.g., current, resistance, etc.), representative of a phase difference between at least two incoming signals.

The example comparator 124 is coupled to the phase detector 122 and the amplifiers 110, 112, 116, and 118. In this example, the comparator 124 receives a voltage representative of the phase difference between the in-phase signals (lines 140, 142) and quadrature signals (lines 144, 146) and sends that voltage to re-tune the amplifiers 110, 112, 116, and 118. The voltage sent to the in-phase amplifiers 110 and 112 and the quadrature amplifiers 116 and 118 will include common mode and differential mode components. The common mode voltage sent to the in-phase amplifiers 110 and 112 and the quadrature amplifiers 116 and 118 will be same. Additionally, the differential voltage sent to the in-phase amplifiers 110 and 112 will be equal in magnitude but opposite in polarity to the voltage sent to the quadrature amplifiers 116 and 118. The comparator 124 generates a metric to be sent to the amplifiers 110, 112, 116, and 118. The metric sent to the amplifiers 110, 112 can be equal in magnitude and opposite in polarity to the metric sent to amplifiers 116, 118. For example, the comparator 124 may output a differential voltage for the in-phase amplifiers 110 and 112 of 100 mV (millivolts), thus, simultaneously sending a voltage to the quadrature amplifiers 116 and 118 of −100 mV. The voltage sent to the amplifiers 110, 112, 116, and/or 118 tunes the amplifiers, which apply a new gain to adjust the phase of the incoming signals (e.g., the in-phase signals (lines 140, 142) and the quadrature signals (lines 144, 146)). Examples disclosed herein include continuously detecting and correcting the phase difference between two incoming signals (e.g., the in-phase signals (lines 140, 142) and the quadrature signals (lines 144, 146)). The examples disclosed herein include a closed loop topology between the I/Q generator 106, the continuous phase corrector 102, and the receiver 104, thus allowing for uninterrupted phase detection and phase imbalance correction. The disclosed topology allows for the continuous phase correction, performed without interruption to transmission and/or reception, of signals used in transmission and/or reception.

The example receiver amplifier 126 is coupled to the mixers 128, 130 of the receiver. The receiver amplifier 126 may be a low noise amplifier. In this case, the receiver amplifier 126 is an electronic amplifier that amplifies a low-power signal without degrading the signal-to-noise ratio. Additionally, the receiver amplifier 126 may be any other amplifier used to affect an incoming signal. As stated earlier, other examples include coupling the continuous phase corrector 102 to a transmitter. In this case, the topology would be similar with the continuous phase corrector 102 coupled to the mixers in an example transmitter.

The example mixers 128, 130 are used to translate the frequency of the incoming signal 127 from the receiver amplifier 126 to the desired frequency that can pass through the filters 132, 134. The example mixers 128, 130 receive the incoming signal 127, combined with a local oscillator 108 signal (e.g., the in-phase signals (lines 140, 142) and the quadrature signals (lines 144, 146)), to produce the output signals (e.g., lines 129, 131, 133, 135). In the example disclosed herein, the mixers 128, 130 receive differential signals (e.g., the in-phase signals (lines 140, 142) and the quadrature signals (lines 144, 146), respectively), and such, tune multiple parts of the incoming signal 127. Generally, the mixers 128, 130 will output at least two signals which are at the frequency of either the sum or difference of the in-phase signal frequencies and/or the quadrature signal frequencies. The mixers 128, 130 may be unbalanced mixers, single balanced mixers, double balanced mixers, etc. The mixers 128, 130 may be implemented as a network of devices, as hardware such as in an integrated chip, or on software.

The example signal filters 132, 134 filter the resulting output signals (e.g., lines 129, 131 and lines 133, 135, respectively) after leaving the mixers 128, 130, respectively. The signal filters 132, 134 may be bandpass filters, high pass filters, low pass filters, or any combination of the three. The signal filters 132, 134 may be implemented with discrete components, as a network of devices, or in software.

The example converters 136, 138 are coupled to the output of the signal filters 132, 134. The converters 136, 138 convert the incoming signals from the signal filters 132, 134 into another type (e.g., analog to digital, digital to analog, analog to analog, digital to digital, etc.).

Figure 2:
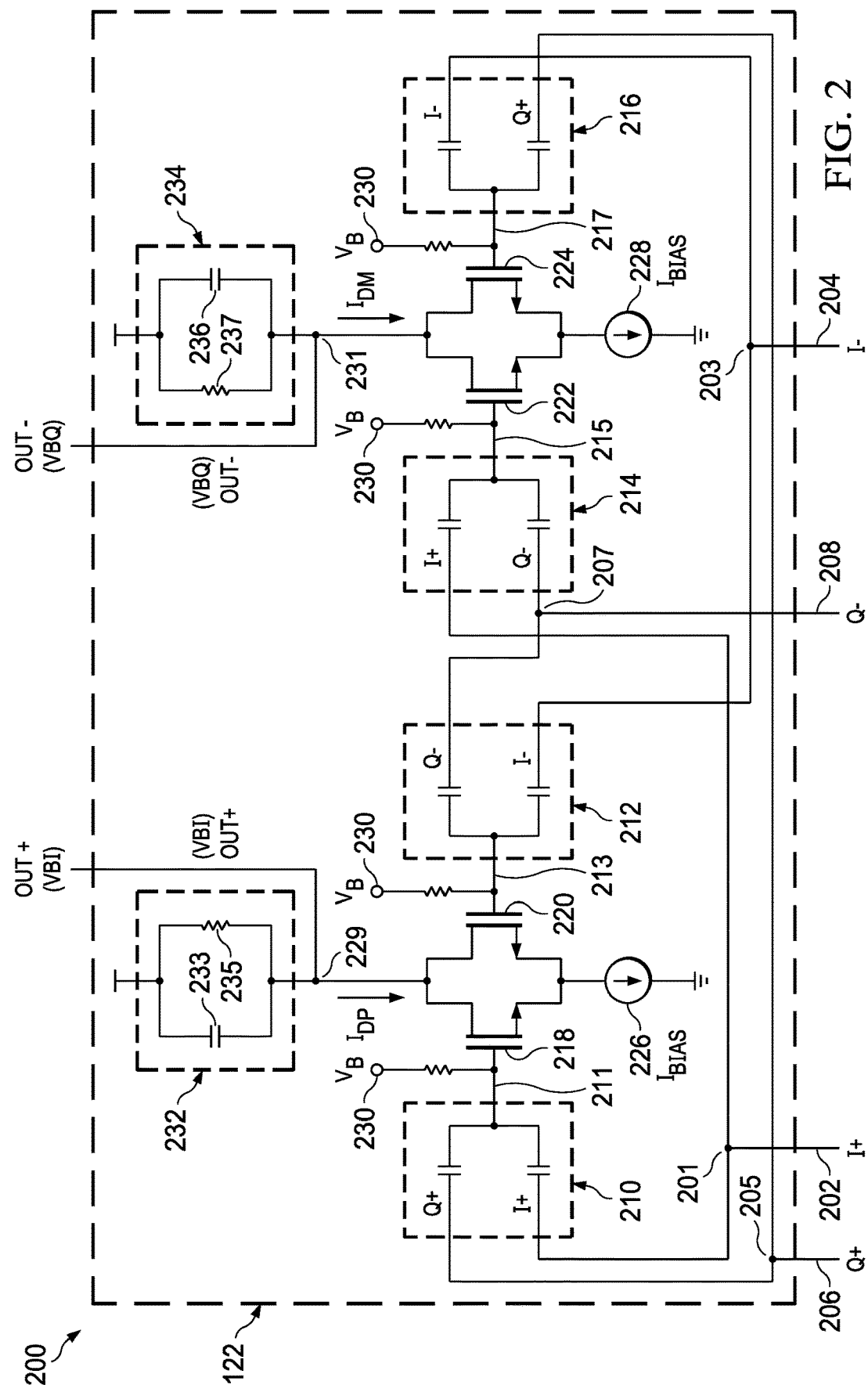
FIG. 2 is a schematic illustrating additional detail of the example phase detector of FIG. 1.

FIG. 2 is a schematic 200 illustrating additional detail of the example phase detector 122 of FIG. 1. The incoming differential signals (lines 202, 204, 206, and 208) may also be any incoming differential input coupled to the phase detector 122. In examples disclosed herein, the phase detector 122 is coupled to the incoming differential signals (lines 202, 204, 206, and 208) using respective intermediate input connectors (201, 203, 205, 207) located in the phase detector 122. The phase detector 122 receives the differential in-phase and differential quadrature signals (lines 202, 204, and lines 206, 208). In the example illustrated in FIG. 2, the differential signals (lines 202 and 206) are sent to the summing junction 210, the differential signals (lines 204 and 208) are sent to the summing junction 212, the differential signals (lines 202 and 208) are sent to the summing junction 214, and the differential signals (lines 204 and 206) are sent to the summing junction 216. The summing junctions 210, 212, 214, and 216 are coupled to the gate terminal of transistors 218, 220, 222, and 224 respectively. Additionally, a direct current biasing voltage (DC bias voltage 230) is coupled to the gate terminals of the transistors 218, 220, 222, and 224. The source terminals of transistors 218 and 220 are coupled to the DC bias current 226. Likewise, the source terminals of transistors 222 and 224 are coupled to the direct current bias (e.g., DC bias current 228). An impedance 232 is coupled to the drain terminals of the parallel-coupled transistors 218 and 220. Similarly, an impedance 234 is coupled to the drain terminals of the parallel-coupled transistors 222 and 224. The phase detector 122 produces two output signals, Out+ (VBI) and Out− (VBQ). The output signals VBI and VBQ are coupled to respective output connectors (229, 231) in the phase detector 122. Furthermore, the output signals VBI and VBQ are coupled to the comparator 124 of FIG. 1 through the respective output connectors (229, 231). The output value (VBI) includes a first output value and a first output phase. The output value (VBQ) includes the first output value at a second output phase. The second output phase is opposite to the first output phase. In examples disclosed herein, the output signals VBI and VBQ are functions of a phase difference between the in-phase signals (lines 202, 204) and the quadrature signals (lines 206, 208).

The example differential signals (lines 202, 204) represent the in-phase signals (e.g., lines 140, 142 of FIG. 1). The differential signals (lines 202, 204) are equal in magnitude and opposite in polarity. Likewise, the differential signals (lines 206, 208) represent the quadrature signals (e.g., lines 144, 146 of FIG. 1). The differential signals (lines 206, 208) are equal in magnitude and opposite in polarity.

The example summing junction 210 sums a quadrature plus (Q+) signal (line 206) with an in-phase plus (I+) signal (line 202), and the summing junction 212 sums a quadrature minus (Q−) signal (line 208) with an in-phase minus (I−) signal (line 204). Additionally, the summing junction 214 sums the I+ signal (line 202) with then Q− signal (line 208), and the summing junction 216 sums the I− signal (line 204) with the Q+ signal (line 206). The summing junctions 210, 212, 214, and 216 generate signals respective of the sum of the respective inputs (the signals at lines 211, 213, 215, and 217, respectively). The sum is preformed through a set of capacitors. Other examples of summing the incoming signals such as using an integrated chip, set of resistors, transformers, power combiners, etc., may be used.

The example transistor 218 is coupled to the summing junction 210. In this example, the gate terminal of the transistor 218 receives two signals, a DC bias voltage 230 and the output of the summing junction 210 (e.g., line 211). The transistor 218 may be a metal oxide semiconductor field effect transistor (MOSFET), a bi-polar junction transistor (BJT), or any other three-terminal device.

The example transistor 220 is coupled to the summing junction 212. In this example, the gate terminal of the transistor 220 receives two signals, a DC bias voltage 230 and the output of the summing junction 212 (e.g., line 213). The transistor 220 may be a metal oxide semiconductor field effect transistor (MOSFET), a bi-polar junction transistor (BJT), or any other three-terminal device.

The example transistor 222 is coupled to the summing junction 214. In this example, the gate terminal of the transistor 222 receives two signals, a DC bias voltage 230 and the output of the summing junction 214 (e.g., line 215). The transistor 222 may be a metal oxide semiconductor field effect transistor (MOSFET), a bi-polar junction transistor (BJT), or any other three-terminal device.

The example transistor 224 is coupled to the summing junction 216. In this example, the gate terminal of the transistor 224 receives two signals, a DC bias voltage 230 and the output of the summing junction 216 (e.g., line 217).

The transistor 224 may be a metal oxide semiconductor field effect transistor (MOSFET), a bi-polar junction transistor (BJT), or any other three-terminal device.

The example DC bias current 226 is coupled to the source terminals of the parallel-coupled transistors 218 and 220. The DC bias current 226 is representative of the DC current flowing through the impedance 232, with half of the DC bias current 226 flowing through transistor 218 and the other half flowing through the transistor 220. Example methods to bias transistors include constant voltage biasing or constant current biasing. Constant voltage biasing sets a fixed $V_{GS}$ voltage between the gate and source nodes of a transistor, whereas constant current biasing sets a constant current through the transistor. This example depicts constant current biasing. The transistors 218 and 220 are biased to draw a constant DC current from a supply. Another example of biasing the transistors 218 and 220 include setting a fixed DC bias voltage 230 between the gate and source. As a result of the DC bias voltage 230, a DC bias current 226 ($I_{DC}$ or $I_{BIAS}$), governed by transistor operation, occurs. In this example, the DC bias current 226 flowing through the transistors 218 and 220 is dependent on the DC bias voltage 230 between the gate and source and also transistor 218 and 220 operation. Irrespective of which method is used, the transistors 218 and 220 are biased with a DC current ($I_{DC}$).

The example DC bias current 228 is coupled to the source terminals of the parallel-coupled transistors 222 and 224. The DC bias current 228 is representative of the DC current flowing through the impedance 234, with half of the DC bias current 228 flowing through transistor 222 and the other half flowing through the transistor 224. This example depicts constant current biasing. The transistors 222 and 224 are biased to draw a constant DC current ($I_{DC}$) from a supply. Another example of biasing the transistors 222 and 224 include setting a fixed DC bias voltage between the gate and source. As a result of the DC bias voltage, a DC bias current 228 ($I_{DC}$ or $I_{BIAS}$), governed by transistor operation, occurs. In this example, the DC bias current flowing through the transistors 222 and 224 is dependent on the DC bias voltage between the gate and source and also the transistor 222 and 224 operation. Irrespective of which method is used, the transistors 222 and 224 are biased with a DC current ($I_{DC}$).

The example DC bias voltage 230 is coupled to the gate terminals of transistors 218, 220, 222, and 224 respectively. The DC bias voltage 230 is set so the gate to source voltage ($V_{GS}$) is very close to the threshold voltage of the transistors 218, 220, 222, and 224. Since the transistors 218, 220, 222, and 224 have equivalent device characteristics, the DC bias voltage 230 will be the same for all transistors 218, 220, 222, and 224. The DC bias currents 226, 228 set a DC current ($I_{DC}$) through the transistors. The DC bias voltage 230 is used to ensure the transistors can accept the current set by the DC bias current 226, 228. The DC bias current 226, 228 is used to ensure no output (e.g., zero Volts at the VBI and VBQ terminals) when the in-phase signal is exactly 90 degrees apart from the quadrature signal. Other examples include changing the DC bias currents 226, 228 to ensure no output (e.g., zero Volts at the VBI and VBQ terminals) when the phase of the in-phase signals (lines 202, 204) differ in phase from the quadrature signals (lines 206, 208) at another specified phase imbalance.

The example impedance 232 is coupled to the drain terminals of the parallel-coupled transistors 218 and 220. The impedance 232 may be resistive, capacitive, inductive, or any combination. The impedance 232 includes a capacitor 233 parallel coupled to a resistor 235. The impedance 232 creates a voltage at the output connector 229 dependent on the drain current $i_{dp}$. The drain current $i_{dp}$ is a function of the DC bias current 226 and the voltage of the in-phase signals (e.g., lines 202, 204) and the quadrature signals (e.g., lines 206, 208).

The example impedance 234 is coupled to the drain terminals of the parallel-coupled transistors 222 and 224. The impedance 234 may be resistive, capacitive, inductive, or any combination. The impedance 234 includes a capacitor 236 parallel coupled to a resistor 237. The impedance 234 creates a voltage at the output node VBQ dependent on the drain current $i_{dm}$. The drain current $i_{dm}$ is a function of the DC bias current 228 and the voltage of the in-phase signals (e.g., lines 202, 204) and the quadrature signals (e.g., lines 206, 208).

In general, the drain current of a transistor is given to be the following:

$$i_d = \alpha_1 * v_{gs} + \alpha_2 * v_{gs}^2 \alpha_3 * v_{gs}^3 \qquad (1)$$

In Equation 1, the variable $v_{gs}$ is the gate to source voltage of the transistor (e.g., the transistors 218, 220, 222, or 224), the variable $\alpha_1$ represents the DC current gain in the transistor (e.g., transistors 218, 220, 222, or 224) during the first harmonic, the variable $\alpha_2$ represents the DC current gain in the transistor (e.g., transistors 218, 220, 222, or 224) during the second harmonic, the variable $\alpha_3$ represents the DC current gain in the transistor (e.g., transistors 218, 220, 222, or 224) during the third harmonic, and the variable $i_d$ represents the transistor (e.g., transistors 218, 220, 222, or 224) drain current.

Due to the topology of the schematic 200, when the drain current is generated (e.g., the drain current ($i_d$) of Equation 1), the odd harmonic components cancel out and drain current ($i_d$) is a function of the squared term (e.g., the $\alpha_2$ term). More specifically, due to the differential operation of the in-phase signals (lines 202, 204) and quadrature signals (lines 206, 208) and identical transistors 218, 220, 222, and 224, each transistor 218, 220, 222, and 224 is fed with signals (e.g., lines 202, 204, 206, and 208, respectively) that are equal in magnitude but opposite polarity. Therefore, odd harmonics are equal in magnitude but with opposite polarity. Thus, at the drain terminal of the parallel-coupled transistors 218 and 220 and the parallel-coupled transistors 222 and 224, the odd harmonics with opposite polarity are summed and cancel each other. Therefore, only the middle term (e.g., the squared term) results. Thus, the drain current $i_{dp}$ of the parallel-coupled transistors 218 and 220 becomes:

$$i_{dp} = \alpha_2 * (V_{BIAS} + (v_i + v_q))^2 + \alpha_2 * (V_{BIAS} - (v_i + v_q))^2 \qquad (2)$$

In Equation 2, the variable $i_{dp}$ represents the drain current of the parallel-coupled transistors 218 and 220, the variable $\alpha_2$ represents the DC current gain in the transistor (e.g., transistors 218, 220, 222, or 224) during the second harmonic, the variable $V_{BIAS}$ is the DC biasing voltage (e.g., the DC bias voltage 230), the variable $v_i$ is equivalent to the magnitude of the voltage of the in-phase signals (lines 202, 204) and the variable $v_q$ is equivalent to the magnitude of the voltage of the quadrature signals (lines 206, 208).

Equation 2 further simplifies to:

$$i_{dp} = I_{DC} + c * (v_i * v_q) \qquad (3)$$

In Equation 3, the variable $I_{DC}$ represents the direct current (DC) transistor current (e.g., the DC current conducting through transistors 218, 220, 222, or 224). In examples disclosed herein, the variable $I_{DC}$ is proportional to the variable $\alpha_2$ and $V_{BIAS}$. The variable c represents a coefficient proportional to the variable $\alpha_2$.

Similarly, $i_{dm}$ becomes:

$$i_{dm}=\alpha_2*(V_{BIAS}-(v_i-v_q))+\alpha_2*(V_{BIAS}+(v_i-v_q))^2 \qquad (4)$$

In Equation 4, $i_{dm}$ is the drain current of the parallel-coupled transistors 222 and 224.

Equation 4 further simplifies to:

$$i_{dm}=I_{DC}-c*(v_i*v_q) \qquad (5)$$

Therefore, the voltage VBI will be the current from equation (3) divided by the impedance 232. Further, the voltage VBQ will be the current from equation (5) divided by the impedance 234. Since the in-phase signals (lines 202, 204) and quadrature signals (lines 206, 208) are equivalent in magnitude, one of ordinary skill in the art can appreciate that the output is essentially a squared metric representative of the incoming signals. Thus, the operation of the transistors, along with a biasing metric (or biasing input), create a squaring circuit in which the output voltage is proportional to a squared metric of the inputs.

Figure 3:
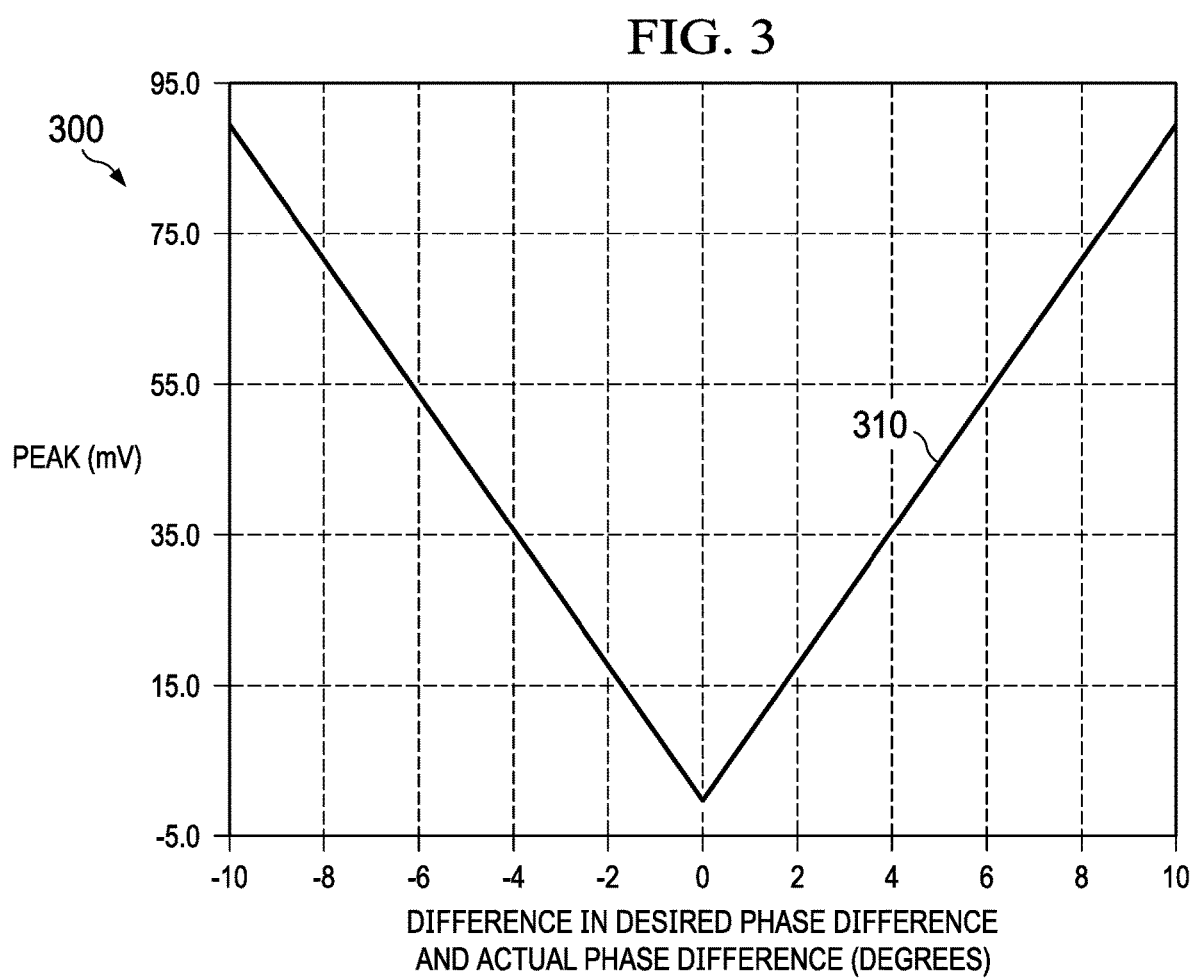
FIG. 3 is a graphical illustration of phase difference between the in-phase signals and the quadrature signals versus output voltage of in-phase signals and the quadrature signals.

FIG. 3 is a graphical illustration 300 of phase difference between the in-phase signals (e.g., lines 202, 204 of FIG. 2) and the quadrature signals (e.g., lines 206, 208 of FIG. 2) versus output voltage of in-phase signals (e.g., lines 202, 204 of FIG. 2) and the quadrature signals (e.g., lines 206, 208 of FIG. 2). The horizontal axis depicts the difference in desired phase difference and actual phase difference between the in-phase signal (e.g., lines 202, 204 of FIG. 2 or lines 140, 142 of FIG. 1) and quadrature signals (e.g., lines 206, 208 of FIG. 2 or lines 144, 146 of FIG. 1). The vertical axis depicts the differential voltage (mV) produced as a result of the corresponding difference. The feedback signal 310 depicts the mV produced. The mV value corresponding to the phase difference is the voltage value difference between the VBI and VBQ nodes of FIG. 2 and FIG. 1. For example, if the desired phase difference between the in-phase signals (e.g., lines 202, 204 of FIG. 2 or lines 140, 142 of FIG. 1) and quadrature signals (e.g., lines 206, 208 of FIG. 2 or lines 144, 146 of FIG. 1) is 90 degrees and the actual phase difference between the in-phase signal (e.g., lines 202, 204 of FIG. 2 or lines 140, 142 of FIG. 1) and quadrature signals (e.g., lines 206, 208 of FIG. 2 or lines 144, 146 of FIG. 1) is 86 degrees, the voltage at the VBI node will be approximately 17.5 mV and the voltage at the VBQ node will be approximately –17.5 mV, because of a 4-degree difference in desired phase difference and actual phase difference. In other examples, the voltage value may not be in millivolts and may be in microvolts, volts, etc. In other examples, the voltage at the VBI and VBQ nodes may not directly correlate to the illustration in FIG. 3. It can be appreciated by one of ordinary skill in the art that the illustration shown in FIG. 3 shows a correlation between the desired phase difference and the actual phase difference, where the mV value produced may vary.

The graphical illustration in FIG. 3 includes the feedback signal 310 illustrating the mV value corresponding to the VBI and VBQ nodes of FIG. 2. The feedback signal 310 may be implemented as a continuous-time signal or as a discrete-time signal. For example, the output of the phase detector 122 of FIG. 3 (e.g., VBI, VBQ) may be a continuous-time output or a discrete-time output. A continuous-time output may be an analog voltage, an analog current, or any value existing in continuous-time. A discrete-time output may be a sampled voltage, a digital voltage or any value existing in discrete-time. The feedback signal 310 may be applied using an analog to digital converter (ADC) or a current digital to analog converter (current-DAC).

Figure 4:
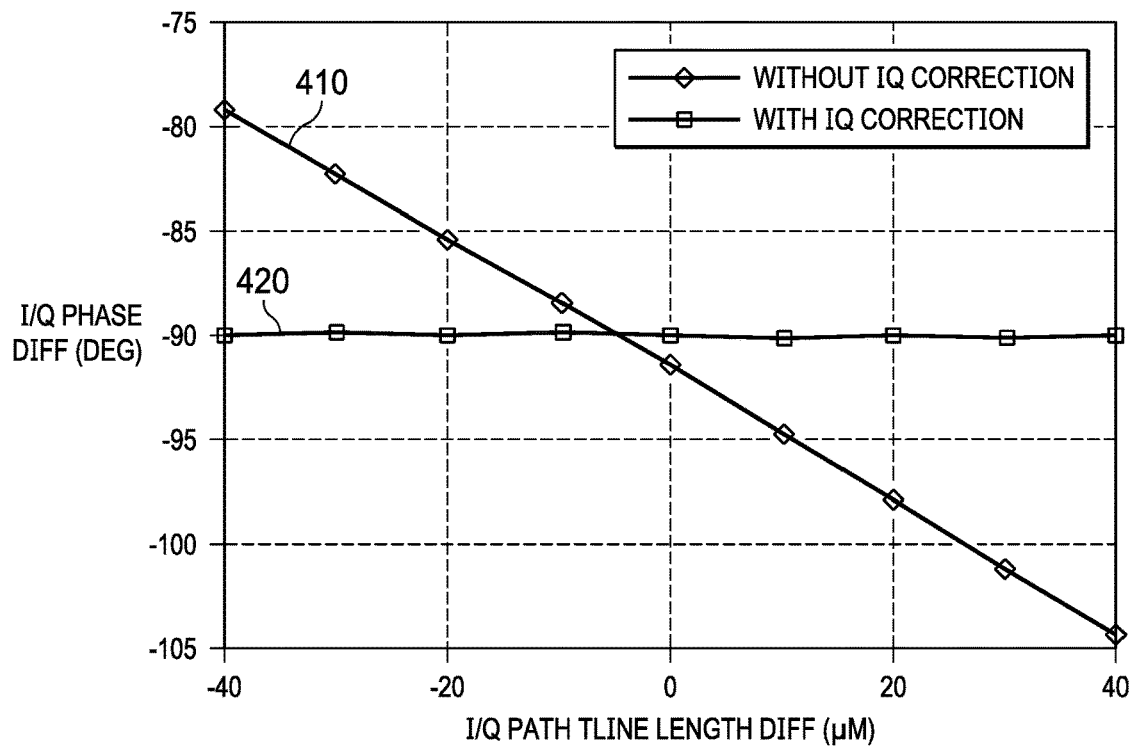
FIG. 4 is a graphical illustration of a simulated relationship between length of transmission line versus phase difference, with and without phase correction applied.

FIG. 4 is a graphical illustration 400 of a simulated relationship between length of transmission line versus phase difference, with and without phase correction applied. The simulation depicted is generated using a simulation test bench to verify the operation of the phase detector. The horizontal axis shows the length that the in-phase signals (e.g., lines 202, 204 of FIG. 2 or lines 140, 142 of FIG. 1) and quadrature signals (e.g., lines 206, 208 of FIG. 2 or lines 144, 146 of FIG. 1) travel on a transmission line, in micrometers. The vertical axis shows the phase difference between the in-phase signals (e.g., lines 202, 204 of FIG. 2 or lines 140, 142 of FIG. 1) and quadrature signals (e.g., lines 206, 208 of FIG. 2 or lines 144, 146 of FIG. 1), in degrees. Data set 410 depicts the relationship without in-phase and quadrature phase correction applied. As the length of distance that the in-phase signals (e.g., lines 202, 204 of FIG. 2 or lines 140, 142 of FIG. 1) and quadrature signals (e.g., lines 206, 208 of FIG. 2 or lines 144, 146 of FIG. 1) travel increase, the in-phase and quadrature difference in desired phase (90-degree desired phase) and actual phase also increases. After in-phase and quadrature phase correction have been applied, the difference in desired phase and actual phase difference remains constant 420 regardless of the length of the transmission line. Depicted in FIG. 4, after applying continuous phase correction to the in-phase signals (e.g., lines 202, 204 of FIG. 2 or lines 140, 142 of FIG. 1) and quadrature signals (e.g., lines 206, 208 of FIG. 2 or lines 144, 146 of FIG. 1), length no longer affects the in-phase and quadrature signals.

Figure 5:
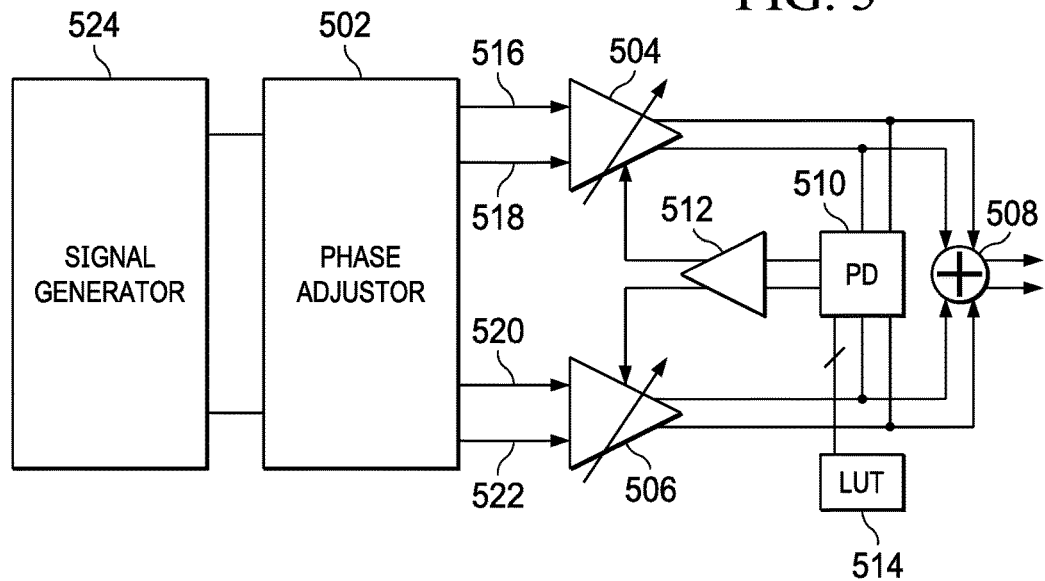
FIG. 5 is a block diagram of a system including a continuous phase detector coupled with a lookup table and a phase adjustor.

FIG. 5 is a block diagram of a system 500 including a phase detector 510 coupled with a lookup table 514 and a phase adjustor 502. The example disclosed in FIG. 5 allows for phase correction between an in-phase signal and an out-of-phase signal. An example phase adjustor 502 is coupled to amplifiers 504 and 506. Additionally, the output of the amplifiers 504 and 506 is coupled to an adder block 508 and a phase detector 510. The input of the phase detector 510 is coupled to a lookup table 514. The output of the phase detector 510 is coupled to a comparator 512. The output of the comparator 512 is coupled to the amplifiers 504 and 506. In the example system 500, the phase detector 510 can generate a voltage output that will be zero volts when the phase difference is a degree value other than 90 degrees, as in the previous example.

The example phase adjustor 502 generates in-phase signals (lines 516, 518) and out-of-phase signals (lines 520, 522). The in-phase signals (lines 516, 518) include a reference phase in which the out-of-phase signals (lines 520, 522) may include a phase shift of any numerical value. The phase adjustor 502 receives a high frequency signal, for example a signal with a frequency of 125 gigahertz, and generates respective in-phase signals (lines 516, 518) and out-of-phase signals (lines 520, 522). The high frequency signal may be a radio frequency signal, a local oscillator signal, a baseband signal, etc. In this case, the in-phase signals (lines 516, 518) and out-of-phase signals (lines 520, 522) are differential signals, thus, the output of the phase adjustor 502 will be four signals (e.g., differential in-phase signal (lines 516, 518) and a differential out-of-phase signal (lines 520, 522)). The phase adjustor 502 may be tuned to create any desired or predetermined phase difference value (e.g., 30 degrees, 45 degrees, etc.) between the in-phase signals (lines 516, 518) and out-of-phase signals (lines 520, 522). The desired phase difference between the in-phase signals (lines 516, 518) and the out-of-phase signals (lines 520, 522) may be generated with a propagation delay.

The example amplifiers 504 and 506 amplify the signals (lines 516, 518, 520, and 522, respectively) sent from the phase adjustor 502. The amplifiers 504 and 506 may apply a gain to the in-phase signals (lines 516 and 518) and/or the out-of-phase signals (lines 520 and 522) to adjust a phase. Additionally, the amplifiers 504 and 506 may apply the gain to the in-phase signals (lines 516 and 518) and/or the out-of-phase signals (lines 520 and 522) in multiple stages. The amplifiers 504 and 506 receive a tuning input from the comparator 512. The input from the comparator 512 adjusts the gain applied to the signals from the phase adjustor 502. In this way, the phase of the in-phase signals (lines 516 and 518) and/or out-of-phase signals (lines 520 and 522) may be adjusted. This may be done continuously and without interruption.

The example adder block 508 sums the in-phase signals (lines 516, 518) and out-of-phase signals (lines 520, 522). The adder block 508 generates a signal at a desired phase shift. The adder block 508 may be created as a single device, network of devices, or any other method of generating an adder.

The example phase detector 510 detects the phase difference between the in-phase signals (lines 516, 518) and the out-of-phase signals (lines 520, 522). The phase detector 510 is coupled to a lookup table 514. In this example, the phase detector 510 can be biased to output a zero voltage at a variable phase difference. For example, if the desired phase difference is 45 degrees, the phase detector 510 receives a biasing input (e.g., current or voltage) from the lookup table 514. The biasing input (e.g., current or voltage) is configured to allow the phase detector 510 to output zero voltage (e.g., indicating the desired phase difference is satisfied) when the in-phase signals (lines 516, 518) and out-of-phase signals (lines 520, 522) are 45 degrees apart. The desired phase difference is variable.

The example comparator 512 is coupled to the phase detector 510 and the amplifiers 504 and 506. In this example, the comparator 512 receives a voltage representative of the phase difference between the in-phase signals (lines 516, 518) and out-of-phase signals (lines 520, 522) and sends that voltage to re-tune the amplifiers 504 and 506. The voltage sent to the amplifier 504 is equal in magnitude to the voltage sent to the amplifier 506. Additionally, the voltage sent to the amplifier 504 is opposite in polarity to the voltage sent to the amplifier 506. For example, the comparator 512 may output a voltage for the amplifier 504 of 100 mV, thus, simultaneously sending a voltage to the amplifier 506 of −100 mV. The voltage sent to the amplifiers 504 and/or 506 tune the amplifiers which in turn apply a new gain to adjust the phase response of the incoming signals. Examples disclosed herein include continuously detecting and correcting the phase difference between two incoming signals. The example disclosed includes no interruption of service.

The example lookup table 514 is coupled to the phase detector 510. The lookup table 514 provides a biasing input (e.g., current or voltage) for the phase detector 510. The lookup table 514 is used for initial calibration of the phase detector 510. In this manner, the lookup table 514 allows for the detection of variable phase difference between the in-phase signals (lines 516, 518) and the out-of-phase signals (lines 520, 522). The lookup table 514 may be implemented in hardware, such as a digital logic lookup table, or software, such as an array. The lookup table 514 sends a biasing input to the phase detector 510, which varies as the desired phase difference between the in-phase signals (lines 516, 518) and out-of-phase signals (lines 520, 522) varies.

The signal generator 524 creates a signal for the phase adjustor 502. The signal generator 524 is used to create a signal for the system 500. The signal created by the signal generator 524 is a millimeter wave signal. Additionally, the signal generator 524 may create a radio frequency (RF) signal, a baseband signal, or any other type of signal. The signal generator 524 creates a differential signal (e.g., a signal including two components) for use by the phase adjustor 502. The signal generator 524 may be a crystal oscillator, variable frequency oscillator, frequency synthesizer, etc.

Figure 6:
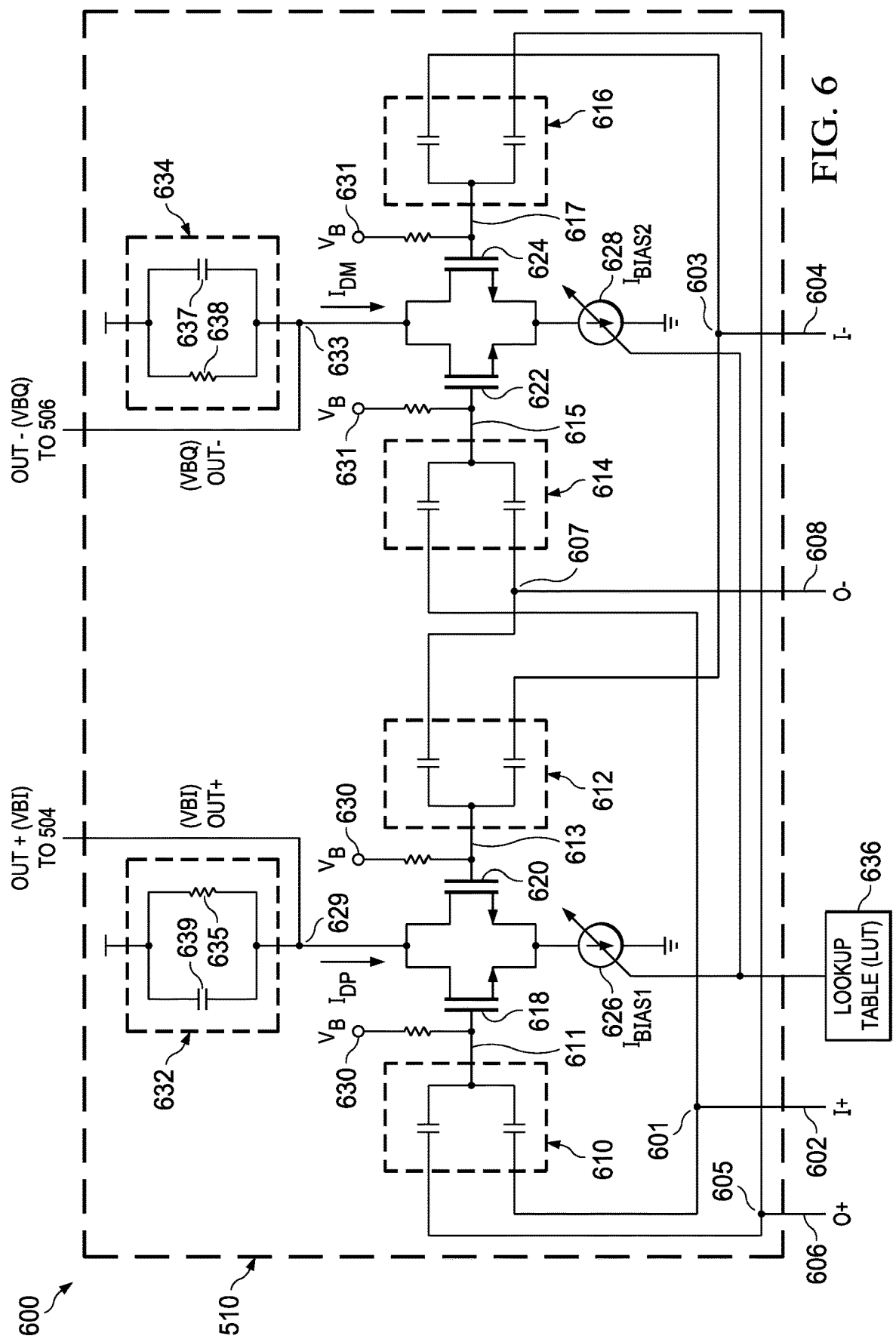
FIG. 6 is a schematic illustrating an example lookup table used with the example phase detector of FIG. 5.

FIG. 6 is a schematic 600 illustrating an example lookup table 636 used with the example phase detector 510 of FIG. 5. The phase detector 510 of FIG. 5 receives the differential in-phase signals (lines 602, 604) and differential out-of-phase signals (lines 606, 608). The incoming differential signals (lines 602, 604, 606, and 608) may also be any incoming differential input coupled to the phase detector 510. In examples disclosed herein, the phase detector 510 is coupled to the incoming differential signals (lines 602, 604, 606, and 608) using respective intermediate input connectors (601, 603, 605, and 607) located in the phase detector 122. In the example illustrated in FIG. 6, the differential signals (lines 602 and 606) are sent to the summing junction 610, the differential signals (lines 604 and 608) are sent to the summing junction 612, the differential signals (lines 602 and 608) are sent to the summing junction 614, and the differential signals (lines 604 and 606) are sent to the summing junction 616. The summing junctions 610, 612, 614, and 616 are coupled to the gate terminal of transistors 618, 620, 622, and 624, respectively. Additionally, a direct current biasing voltage 630 (DC bias voltage 630) is coupled to the gate terminals of the transistors 618, 620, and a direct current biasing voltage 631 (DC bias voltage 631) is coupled to the gate terminals of transistors 622, and 624. The source terminals of transistors 618 and 620 are coupled to the variable current bias 626 (e.g., Variable DC bias current 626 or $I_{BIAS1}$ 626). Likewise, the source terminals of transistors 622 and 624 are coupled to the variable current bias 628 (e.g., Variable DC bias current 628 or $I_{BIAS2}$ 628). An impedance 632 is coupled to the drain terminals of the parallel-coupled transistors 618 and 620. Similarly, an impedance 634 is coupled to the drain terminals of the parallel-coupled transistors 622 and 624. The phase detector 510 produces two output signals, Out+ (VBI) and Out− (VBQ). The output signals VBI and VBQ are coupled to respective output connectors (629, 633) in the phase detector 510. Furthermore, the output signals VBI and VBQ are coupled to the comparator 512 of FIG. 5 through the respective output connectors (629, 633). The output value (VBI) includes a first output value and a first output phase. The output value (VBQ) includes the first output value, but additionally a second output phase, where the second output phase will be opposite to the first output phase.

The differential in-phase signals (lines 602, 604) are equal in magnitude and opposite in polarity. Likewise, the differential out-of-phase signals (lines 606, 608) represent the out-of-phase signal. The differential out-of-phase signals (lines 606, 608) are equal in magnitude and opposite in polarity. The incoming differential signals (lines 602, 604, 606, and 608) may also be any incoming differential input coupled to the phase detector 510.

The summing junction 610 sums an out-of-phase plus (O+, 606) signal with an in-phase plus signal (I+, line 602) and the summing junction 612 sums an out-of-phase minus signal (O−, line 608) with an in-phase minus signal (I−, line 604). Additionally, the summing junction 614 sums the I+ signal (line 602) with the O− signal (line 608), and the summing junction 616 sums the I− signal (line 604) with the O+ signal (line 606). The summing junctions 610, 612, 614, and 616 generate a corresponding new signal which is the sum of the respective inputs (e.g., the corresponding output signals (lines 611, 613, 615, 617, respectively)). In an example, summation is preformed through a set of capacitors. Other examples of summing the incoming signals such as through an integrated chip, set of resistors, transformers, power combiners, etc., may be used.

The example transistor 618 is coupled to the summing junction 610. In this example, the gate terminal of the transistor 618 receives two signals, a DC bias voltage 630 and the output of the summing junction 610 (line 611). The transistor 618 may be a metal oxide semiconductor field effect transistor (MOSFET), a bi-polar junction transistor (BJT), or any other three-terminal device.

The example transistor 620 is coupled to the summing junction 612. In this example, the gate terminal of the transistor 620 receives two signals, a DC bias voltage 630 and the output of the summing junction 612 (line 613). The transistor 620 may be a metal oxide semiconductor field effect transistor (MOSFET), a bi-polar junction transistor (BJT), or any other three-terminal device.

The example transistor 622 is coupled to the summing junction 614. In this example, the gate terminal of the transistor 622 receives two signals, a DC bias voltage 631 and the output of the summing junction 614 (line 615). The transistor 622 may be a metal oxide semiconductor field effect transistor (MOSFET), a bi-polar junction transistor (BJT), or any other three-terminal device.

The example transistor 624 is coupled to the summing junction 616. In this example, the gate terminal of the transistor 624 receives two signals, a DC bias voltage 631 and the output of the summing junction 616 (line 617). The transistor 624 may be a metal oxide semiconductor field effect transistor (MOSFET), a bi-polar junction transistor (BJT), or any other three-terminal device.

The example Variable DC bias current 626 is coupled to the source terminals of the parallel-coupled transistors 618 and 620. The Variable DC bias current 626 is representative of the DC current flowing through the impedance 632, with half of the Variable DC bias current 626 flowing through transistor 618 and the other half flowing through the transistor 620. Example methods to bias transistors include constant voltage biasing or constant current biasing. Constant voltage biasing sets a fixed $V_{GS}$ voltage between the gate and source nodes of a transistor, whereas constant current biasing sets a constant current through the transistor. This example depicts constant current biasing. The transistors 618 and 620 are biased to draw a variable DC current from a supply. Example methods to bias the transistors 618 and 620 include setting a fixed DC bias voltage 630 between the gate and source. As a result of the DC bias voltage 630, a Variable DC bias current 626 ($I_{DC\_1}$ or $I_{BIAS1}$) governed by transistor operation, occurs. In this example, the Variable DC bias current 626 flowing through the transistors 618 and 620 is dependent on the DC bias voltage 630 between the gate and source and also the transistor 618 and 620 operation. In this example, the Variable DC bias current 626 will be determined by a value sent from a lookup table 636. Irrespective of which method (e.g., constant voltage bias or constant current bias) is used, the transistors 618 and 620 are biased with a DC current ($I_{DC\_1}$), and $I_{DC\_1}$ will be a variable DC current based on a signal sent from the lookup table 636. Additionally, the Variable DC bias current 626 may be a programmable bias dependent on the lookup table 636. The lookup table 636 and the Variable DC bias current 626 are intended for initial calibration of the phase detector 510.

The example Variable DC bias current 628 is coupled to the source terminals of the parallel-coupled transistors 622 and 624. The Variable DC bias current 628 is representative of the DC current flowing through the impedance 634, with half of the Variable DC bias current 628 flowing through transistor 622 and the other half flowing through the transistor 624. This example depicts constant current biasing. The transistors 622 and 624 are biased to draw a variable DC current from a supply. Example methods to bias the transistors 622 and 624 include setting a fixed DC bias voltage 631 between the gate and source. As a result of the DC bias voltage 631, a variable DC bias current 628 ($I_{DC\_O}$ or $I_{BIAS2}$) governed by transistor operation, occurs. In this example, the Variable DC bias current 628 flowing through the transistors 622 and 624 is dependent on the DC bias voltage 631 between the gate and source and also the transistor 622 and 624 operation. In this example, the Variable DC bias current 628 is determined by a value sent from a lookup table 636. Irrespective of which method is used (e.g., constant current biasing or constant voltage biasing), the transistors 622 and 624 are biased with a DC current ($I_{DC\_O}$), and $I_{DC\_O}$ will be a variable DC current based on a signal sent from the lookup table 636. Additionally, the Variable DC bias current 628 may be a programmable bias dependent on the lookup table 636. The lookup table 636 and the Variable DC bias current 628 are intended for initial calibration of the phase detector 510.

The example DC bias voltage 630 is coupled to the gate terminal of transistors 618, 620. The DC bias voltage 630 is set so the gate to source voltage ($V_{GS}$) is very close to the threshold voltage of the transistors 618 and 620. Since the transistors 618 and 620 have equivalent device characteristics, the DC bias voltage 630 will be the same for the transistors 618 and 620. The Variable DC bias current 626 sets a DC current through the transistors. The DC bias voltage 630 is used to ensure the transistors can accept the current set by the Variable DC bias current 626. The Variable DC bias current 626 is used to ensure no output (e.g., zero Volts at the VBI terminal) when the in-phase signals (lines 602, 604) are exactly a predetermined phase difference apart from the out-of-phase signals (lines 606, 608).

The example DC bias voltage 631 is coupled to the gate terminal of transistors 622, 624. The DC bias voltage 631 is set so the gate to source voltage ($V_{GS}$) is very close to the threshold voltage of the transistors 622 and 624. Since the transistors 622 and 624 have equivalent device characteristics, the DC bias voltage 631 will be the same for the transistors 622 and 624. The Variable DC bias current 628 sets a DC current through the transistors. The DC bias voltage 631 is used to ensure the transistors can accept the current set by the Variable DC bias current 628. The Variable DC bias current 628 is used to ensure no output (e.g., zero Volts at the VBQ terminal) when the in-phase signals (lines 602, 604) are exactly a predetermined phase difference apart from the out-of-phase signals (lines 606, 608).

The example impedance 632 is coupled to the drain terminals of the parallel-coupled transistors 618 and 620. The impedance 632 may be resistive, capacitive, inductive, or any combination. The impedance 632 includes a capacitor 639 parallel coupled to a resistor 635. The impedance 632 creates a voltage at the output connector 629 dependent on the drain current $i_{dp}$. The drain current $i_{dp}$ is a function of the Variable DC bias current 626 and the voltage of the in-phase signals (lines 602, 604) and out-of-phase signals (lines 606, 608).

The example impedance 634 is coupled to the drain terminals of the parallel-coupled transistors 622 and 624. The impedance 634 may be resistive, capacitive, inductive, or any combination. The impedance 634 includes a capacitor 637 parallel coupled to a resistor 638. The impedance 634 creates a voltage at the output connector 629 dependent on the drain current $i_{dm}$. The drain current $i_{dm}$ is a function of the Variable DC bias current 628 and the voltage of the in-phase signals (lines 602, 604) and out-of-phase signals (lines 606, 608).

The example lookup table 636 is coupled to the Variable DC bias current 626 and the Variable DC bias current 628. The lookup table 636 provides information to set the Variable DC bias current 626 and the Variable DC bias current 628 to be specific values. In doing so, the lookup table 636 creates a DC offset for the output voltage of the phase detector 510. The DC offset created by the lookup table 636 allows the phase detector 510 to correct the phase of two signals (e.g., the in-phase signals (lines 602, 604) or the out-of-phase signals (lines 606, 608)) to be any desired phase difference. The lookup table 636 may be implemented in hardware, such as a digital logic lookup table, or software, such as an array.

In general, the drain current of a transistor is given to be the following:

$$i_d = \alpha_1 * v_{gs} + \alpha_2 * v_{gs}^2 + \alpha_3 * v_{gs}^3 \tag{6}$$

In Equation 6, the variable $v_{gs}$ is the gate to source voltage of the transistor (e.g., the transistors 618, 620, 622, or 624), the variable $\alpha_1$ represents the DC current gain in the transistor (e.g., transistors 618, 620, 622, or 624) during the first harmonic, the variable $\alpha_2$ represents the DC current gain in the transistor (e.g., transistors 618, 620, 622, or 624) during the second harmonic, the variable $\alpha_3$ represents the DC current gain in the transistor (e.g., transistors 618, 620, 622, or 624) during the third harmonic, and the variable $i_d$ represents the transistor (e.g., transistors 618, 620, 622, or 624) drain current.

Due to the topology of the schematic 600, when the drain current is generated (e.g., the drain current ($i_d$) of Equation 6), the odd harmonic components are canceled. More specifically, due to the differential operation of the in-phase signals (lines 602, 604) and out-of-phase signals (lines 606, 608) and identical transistors 618, 620, 622, and 624, each transistor 618, 620, 622, and 624 is fed with signals (e.g., lines 602, 604, 606, and 608) that are equal in magnitude but opposite polarity. Therefore, odd harmonics are equal in magnitude but with opposite polarity. Thus, at the drain terminal of the parallel-coupled transistors 618 and 620 and the parallel-coupled transistors 622 and 624, the odd harmonics with opposite polarity are summed and cancel each other. Therefore, only the middle term (e.g., the squared term) results. Thus, the drain current $i_{dp}$ of the parallel-coupled transistors 618 and 620 becomes:

$$i_{dp} = \alpha_2 * (V_{BIAS\_I} + (v_i + v_o))^2 + \alpha_2 * (V_{BIAS\_I} - (v_i + v_o))^2 \tag{7}$$

In Equation 7, the variable $i_{dp}$ represents the drain current of the parallel-coupled transistors 618 and 620, the variable $\alpha_2$ represents the DC current gain in the transistor (e.g., transistors 618, 620, 622, or 624) during the second harmonic, the variable $V_{BIAS\_I}$ is equivalent to the DC bias voltage 630, the variable $v_i$ is equivalent to the magnitude of the voltage of the in-phase signals (lines 602, 604) and the variable $v_o$ is equivalent to the magnitude of the voltage of the out-of-phase signals (lines 606, 608).

Equation 9 further simplifies to:

$$i_{dp} = I_{DC\_I} + c * (v_i * v_o) \tag{8}$$

In Equation 8, the variable $I_{DC\_I}$ represents the DC transistor (e.g., transistors 618, 620) current proportional to $\alpha_2$ and $V_{BIAS\_I}$ and the variable c represents a coefficient proportional to $\alpha_2$.

Similarly, $i_{dm}$ becomes:

$$i_{dm} = \alpha_2 * (V_{BIAS\_O} - (v_i - v_o))^2 + \alpha_2 * (V_{BIAS\_O} + (v_i - v_o))^2 \tag{9}$$

In Equation 9, $i_{dm}$ is the drain current of the parallel-coupled transistors 622 and 624, $V_{BIAS\_O}$ is equivalent to the DC bias voltage 631, the variable $v_i$ is equivalent to the magnitude of the voltage of the in-phase signals (lines 602, 604) and the variable $v_o$ is equivalent to the magnitude of the voltage of the out-of-phase signals (lines 606, 608).

Equation 9 further simplifies to:

$$i_{dm} = I_{DC\_O} - c * (v_i * v_o) \tag{10}$$

Therefore, the voltage VBI will be the current from Equation 8 divided by the impedance 632. Further, the voltage VBQ will be the current from Equation 10 divided the impedance 634. Since the in-phase signals (lines 602, 604) and out-of-phase signals (lines 606, 608) are equivalent in magnitude, one of ordinary skill in the art can appreciate that the output is essentially a squared metric of the incoming signals (e.g., the in-phase signals (lines 602, 604) and the out-of-phase signals (lines 606, 608)). Thus, the operation of the transistors, along with a biasing input, creates a squaring circuit in which the output voltage is proportional to a squared metric of the inputs (e.g., the in-phase signals (lines 602, 604) and the out-of-phase signals (lines 606, 608)).

Figure 7:
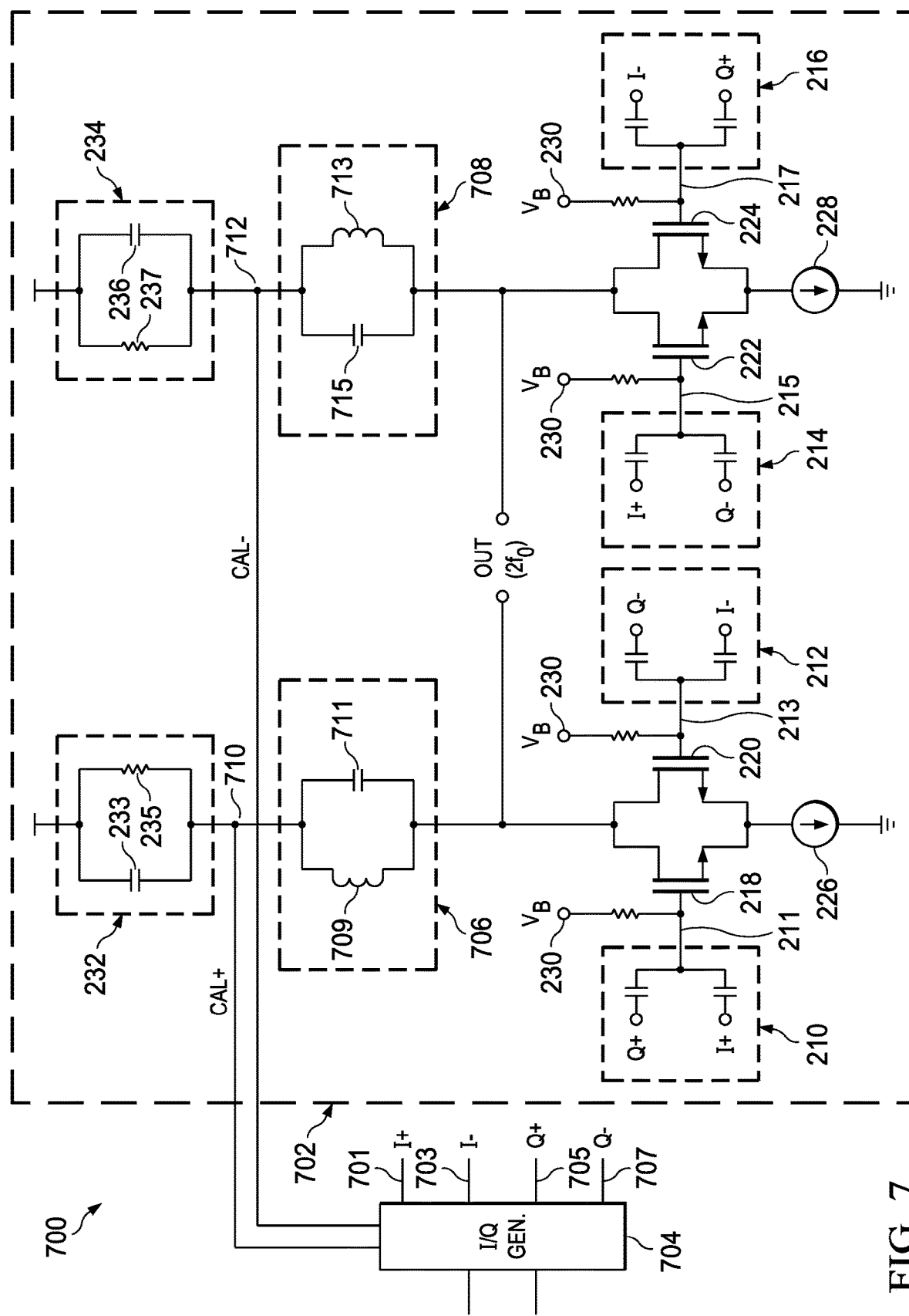
FIG. 7 is a schematic illustrating an example harmonic generating phase detector.

FIG. 7 is a schematic 700 illustrating an example harmonic generating phase detector 702. The harmonic-generating phase detector 702 is coupled to an I/Q generator 704. Examples disclosed herein include an I/Q generator 704 to output in-phase signals (lines 701, 703) and quadrature signals (lines 705, 707). Other examples include a phase adjustor (e.g., the phase adjustor 502 of FIG. 5) in place of the I/Q generator 704, to output in-phase and out-of-phase signals. Examples disclosed herein including a phase adjustor (e.g., the phase adjustor 502 of FIG. 5) include a phase difference between the in-phase signals and the out-of-phase signals of any desired phase amount (e.g., 15 degrees, 45 degrees, etc.). Additionally, the I/Q generator 704 may output any input value for the harmonic-generating phase detector 702. The harmonic-generating phase detector 702 is coupled to example filters 706 and 708. The filters 706, 708 are coupled to two output connectors 710 and 712. Furthermore, the harmonic-generating phase detector 702 includes the summing junctions 210, 212, 214, 216, the transistors 218, 220, 222, 224, the DC bias currents 226, 228, the DC bias voltage 230, the impedances 232, 234, and any other suitable aspect and/or component of FIG. 2.

The phase detector 702 receives the differential in-phase signals (lines 701, 703) and the differential quadrature signals (lines 705, 707). Each differential signal is sent to a summing junction 210, 212, 214, or 216 so that the differential signals may be summed with another signal. The summing junctions 210, 212, 214, and 216 are coupled to the gate terminal of transistors 218, 220, 222, and 224, respectively. Additionally, a direct current biasing voltage 230 (DC bias voltage 230) is coupled to the gate terminals of the transistors 218, 220, 222, and 224. The source terminals of transistors 218 and 220 are coupled to the DC bias current 226. Likewise, the source terminals of transistors 222 and 224 are coupled to the DC bias current 228. An impedance 232 is coupled to the drain terminals of the parallel-coupled transistors 218 and 220. Similarly, an impedance 234 is coupled to the drain terminals of the parallel-coupled transistors 222 and 224. The phase detector 702 produces two output signals (e.g., Cal+ (VBI) at connector 710 and Cal− (VBQ) at connector 712). The output signals VBI and VBQ are coupled to the I/Q Generator 704.

The I/Q generator 704 may receive a high frequency signal, for example, having a frequency of 125 gigahertz, and generate respective in-phase and quadrature signals. Alternatively, the I/Q generator 704 may receive any other frequency signal such as a radio frequency signal (e.g., a 3 kHz signal to a 300 GHz signal). The input of the I/Q generator 704 may be a local oscillator. In this case, the local oscillator is a differential signal, thus, the output of the I/Q generator 704 will be four signals (e.g., differential in-phase signals (lines 701, 703) and the differential quadrature signals (lines 705, 707)). The I/Q generator 704 may be a hybrid coupler in which the desired phase difference between the in-phase signals (lines 701, 703) and quadrature signals (lines 705, 707) is 90 degrees. For example, the output of the in-phase signals (lines 701, 703) would have desired phases of 0 degrees and 180 degrees. Likewise, the output of the quadrature signals (lines 705, 707) would have desired phases of 90 degrees and 270 degrees. In this case, the signals are said to be in quadrature (e.g., 90-degree phase difference). Alternatively, a phase adjustor may take the place of the I/Q generator 704 and create any desired phase difference (e.g., 30 degrees, 45 degrees, etc.). In this case, the signals (e.g., the in-phase signals (lines 701, 703) and the quadrature signals (lines 705, 707)) will not be in quadrature, thus the quadrature signals (lines 705, 707) will become phase-shifted signals (e.g., out-of-phase signals). The desired phase difference between the in-phase signals (lines 701, 703) and the quadrature signals (lines 705, 707) may be generated with a propagation delay. The I/Q generator 704 is coupled to the phase detector 702.

The example filter 706 is coupled in series with the output of the phase detector 702 at the connector 710. The filter 706 generates an output (e.g., CAL+) in which the frequency is twice the fundamental frequency of the input signal. The example disclosed in FIG. 7 will generate an output in which the frequency is twice the I/Q Generator 704 input frequency. For example, if the fundamental frequency of the I/Q generator input signal is 50 megahertz, the frequency created by the filter 706 will be 100 megahertz. Examples disclosed herein are not limited to generating the second harmonic. In examples disclosed herein, the filter 706 modifies the frequency of the output signal (e.g., CAL+) to be any integer multiple of the input signals (e.g., the in-phase signals (lines 701, 703) and/or the quadrature signals (lines 705, 707)). In other examples disclosed herein, the filter 706 modifies the frequency of the output signal (e.g., CAL+) to be any suitable numeric multiple (e.g., decimal multiple, a harmonic multiple) of the input signals (e.g., the in-phase signals (lines 701, 703) and/or the quadrature signals (lines 705, 707)). The filter 706 includes an inductor 709 parallel-coupled to a capacitor 711. In other examples, the filter 706 may include additional components such as resistors, capacitors, and/or inductors, and may produce a frequency other than the second harmonic. Additionally, the example filter 706 may be implemented not only with discrete components, but also as a network of devices or as software.

The example filter 708 is coupled in series with the output of the phase detector 702 at connector 712. The filter 708 generates an output (e.g., CAL−) in which the frequency is twice the fundamental frequency of the input signal. The example disclosed in FIG. 7 will generate an output in which the frequency is twice the I/Q Generator 704 input frequency is. For example, if the fundamental frequency of the I/Q generator 704 input signal is 50 megahertz, the frequency created by the filter 708 will be 100 megahertz. Examples disclosed herein are not limited to generating the second harmonic. In examples disclosed herein, the filter 708 is to modify the frequency of the output signal (e.g., CAL−) to be any integer multiple of the input signal (e.g., the in-phase signals (lines 701, 703) and/or the quadrature signals (lines 705, 707)). In other examples disclosed herein, the filter 708 is to modify the frequency of the output signal (e.g., CAL−) to be any suitable numeric multiple (e.g., decimal multiple, a harmonic multiple) of the input signals (e.g., the in-phase signals (lines 701, 703) and/or the quadrature signals (lines 705, 707)). The filter 708 includes an inductor 713 parallel-coupled to a capacitor 715. In other examples, the filter 708 may include additional components such as resistors, capacitors, and/or inductors, and may produce a frequency other than the second harmonic. Additionally, the example filter 708 may be implemented not only with discrete components, but also as a network of devices or as software.

While an example manner of implementing the continuous phase corrector or phase detector of FIG. 1 is illustrated in FIG. 2, 5, 6, or 7, one or more of the elements, processes and/or devices illustrated in FIG. 2, 5, 6, or 7 may be combined, divided, re-arranged, omitted, eliminated and/or implemented in any other way. Further, the example phase detector 122, 510, 702, the example comparator 124, 512, the example amplifiers 110, 112, 114, 116, 118, 120, the example I/Q generator 106, the example phase adjustor 502, the example summing junction 210, 212, 214, 216, 610, 612, 614, 616, the example transistors 218, 220, 222, 224, 618, 620, 622, 624, the example filters 706, 708, the example adder block 508, the example amplifiers 504, 506, the example lookup table 514, the example signal generator 524, and/or, more generally, the example continuous phase corrector of FIG. 1 or 5 may be implemented by hardware, software, firmware and/or any combination of hardware, software and/or firmware. Thus, for example, any of the example phase detector 122, 510, 702, the example comparator 124, 512, the example amplifiers 110, 112, 114, 116, 118, 120, the example I/Q generator 106, the example phase adjustor 502, the example summing junction 210, 212, 214, 216, 610, 612, 614, 616, the example transistors 218, 220, 222, 224, 618, 620, 622, 624, the example filters 706, 708, the example adder block 508, the example amplifiers 504, 506, the example lookup table 514, the example signal generator 524, and/or, more generally, the example continuous phase corrector of FIG. 1 or 5 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example phase detector 122, 510, 702, the example comparator 124, 512, the example amplifiers 110, 112, 114, 116, 118, 120, the example I/Q generator 106, the example phase adjustor 502, the example summing junction 210, 212, 214, 216, 610, 612, 614, 616, the example transistors 218, 220, 222, 224, 618, 620, 622, 624, the example filters 706, 708, the example adder block 508, the example amplifiers 504, 506, the example lookup table 514, the example signal generator 524, and/or, more generally, the example continuous phase corrector of FIG. 1 or 5, is/are hereby expressly defined to include a non-transitory computer readable storage device or storage disk such as a memory, a digital versatile disk (DVD), a compact disk (CD), a Blu-ray disk, etc. including the software and/or firmware. Further still, the example continuous phase corrector of FIG. 1 may include one or more elements, processes and/or devices in addition to, or instead of, those illustrated in FIGS. 2, 5, 6, 7, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 8:
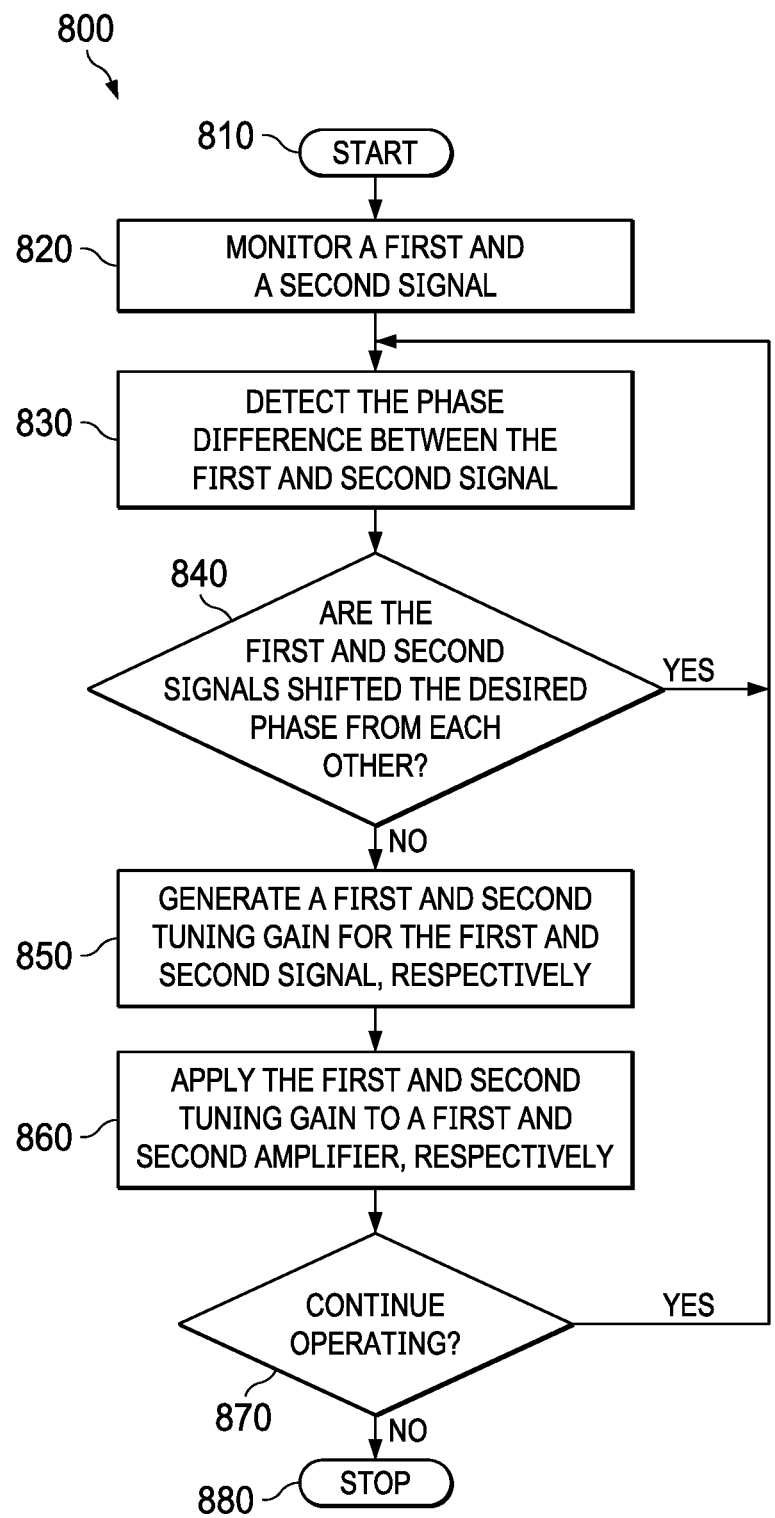
FIG. 8 is a flowchart representative of example machine readable instructions that may be executed to implement the I/Q generator and/or continuous phase corrector of FIGS. 1, 2, 5-7.

A flowchart representative of example hardware logic, machine readable instructions, hardware implemented state machines, and/or any combination thereof for implementing the I/Q generator, and/or the signal generator, and/or the continuous phase corrector of FIG. 1 or 5 is shown in FIG. 8. The machine readable instructions may be an executable program or portion of an executable program for execution by a computer processor such as the processor 912 shown in the example processor platform 900 discussed below in connection with FIG. 8. The program may be embodied in software stored on a non-transitory computer readable storage medium such as a CD-ROM, a floppy disk, a hard drive, a DVD, a Blu-ray disk, or a memory associated with the processor 912, but the entire program and/or parts thereof could alternatively be executed by a device other than the processor 912 and/or embodied in firmware or dedicated hardware. Further, although the example program is described with reference to the flowchart illustrated in FIG. 8, many other methods of implementing the example I/Q generator, the example phase adjustor, and/or continuous phase corrector may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIG. 2, 5, 6, or 7 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

FIG. 8 is a flowchart 800 representative of example machine readable instructions that may be executed to implement the I/Q generator and/or continuous phase corrector of FIGS. 1, 2, 5-7. The process begins with the continuous phase corrector 102 (block 810). A phase detector (e.g., the phase detector 122 of FIG. 1, the phase detector 510 of FIG. 5, or the harmonic generating phase detector 702 of FIG. 1) monitors a first and second signal (block 820). In examples disclosed herein, the first signal includes the differential in-phase signals (e.g., lines 140, 142 of FIG. 1 or lines 701, 703 of FIG. 7) and the second signal includes the differential quadrature signals (e.g., lines 144, 146 of FIG. 1 or lines 705, 707 of FIG. 7). In other examples disclosed herein, the first signal includes the differential in-phase signals (e.g., lines 516, 518 of FIG. 5) and the second signal includes the differential out-of-phase signals (e.g., lines 520, 522 of FIG. 5). The phase detector (e.g., the phase detector 122 of FIG. 1, the phase detector 510 of FIG. 5, or the harmonic generating phase detector 702 of FIG. 1) detects the phase difference between the first and second signals (e.g., lines 140, 142 and/or lines 144, 146, respectively) (block 830).

The phase detector (e.g., the phase detector 122 of FIG. 1, the phase detector 510 of FIG. 5, or the harmonic generating phase detector 702 of FIG. 1) determines if the first and second signals (e.g., lines 140, 142 and/or lines 144, 146, respectively) are shifted the desired phase from each other (block 840). In some examples disclosed herein, the phase detector (e.g., the phase detector 122 of FIG. 1, the phase detector 510 of FIG. 5, or the harmonic generating phase detector 702 of FIG. 1) may determine if the phase of the in-phase signals (e.g., lines 140, 142) and the phase of the quadrature signals (e.g., lines 144, 146) are the desired phase from each other within a threshold value. The example phase detector 122 of FIG. 1, the example phase detector 510 of FIG. 5, and/or the example harmonic-generating phase detector 702 of FIG. 7 may implement block 840. The phase detector (e.g., the phase detector 122 of FIG. 1, the phase detector 510 of FIG. 5, or the harmonic generating phase detector 702 of FIG. 1) generates a first and second tuning gain for the first and second signals, respectively (e.g., lines 140, 142 and/or lines 144, 146, respectively) (block 850). In examples disclosed herein, the phase detector (e.g., the phase detector 122 of FIG. 1, the phase detector 510 of FIG. 5, or the harmonic generating phase detector 702 of FIG. 1) generates the first and second tuning gains in response to detecting a non-desired phase difference (e.g., unwanted phase imbalance) between the two measured signals (e.g., the first and second signals).

A comparator (e.g., the comparator 124 of FIG. 1 or the comparator 512 of FIG. 5) applies the first and second turning gain to a first and second amplifier, respectively (block 860). After the tuning gain is applied, the phase detector (e.g., the phase detector 122 of FIG. 1, the phase detector 510 of FIG. 5, or the harmonic generating phase detector 702 of FIG. 1) determines whether to continue operating (block 870). Examples when the device may cease to operate include loss of power, device damage, etc. In such event, the device stops (block 880). Otherwise, the process will return to block 830 and cycle again.

Figure 9:
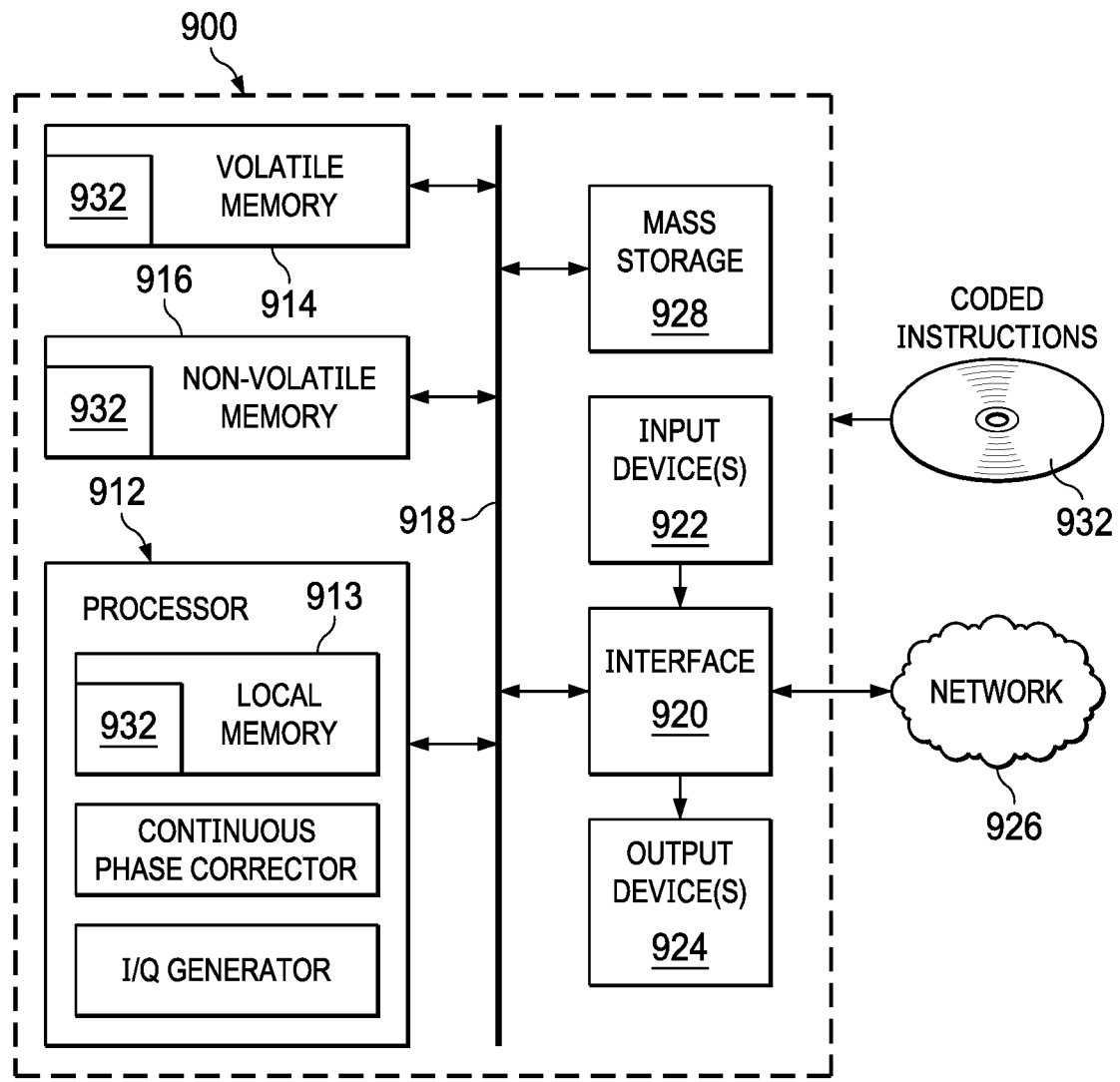
FIG. 9 is a block diagram of an example processing platform structured to execute the instructions of FIG. 8 to implement the I/Q generator or continuous phase corrector of FIGS. 1, 2, 5-7.

FIG. 9 is a block diagram of an example processing platform 900 structured to execute the instructions of FIG. 8 to implement the I/Q generator or continuous phase corrector of FIGS. 1, 2, 5-7. The processor platform 900 can be, for example, a server, a personal computer, a workstation, a self-learning machine (e.g., a neural network), a mobile device (e.g., a cell phone, a smart phone, a tablet), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 900 of the illustrated example includes a processor 912. The processor 912 of the illustrated example is hardware. For example, the processor 912 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the continuous phase corrector and the I/Q generator.

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 916 may be implemented by flash memory and/or any other desired type of memory device. Access to the main memory 914, 916 is controlled by a memory controller.

The processor platform 900 of the illustrated example also includes an interface circuit 920. The interface circuit 920 may be implemented by any type of interface standard, such as an Ethernet interface, a universal serial bus (USB), a Bluetooth® interface, a near field communication (NFC) interface, and/or a PCI express interface.

In the illustrated example, one or more input devices 922 are connected to the interface circuit 920. The input device(s) 922 permit(s) a user to enter data and/or commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 920 of the illustrated example, thus, typically includes a graphics driver card, a graphics driver chip and/or a graphics driver processor.

The interface circuit 920 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 926. The communication can be via, for example, an Ethernet connection, a digital subscriber line (DSL) connection, a telephone line connection, a coaxial cable system, a satellite system, a line-of-site wireless system, a cellular telephone system, etc.

The processor platform 900 of the illustrated example also includes one or more mass storage devices 928 for storing software and/or data. Examples of such mass storage devices 928 include floppy disk drives, hard drive disks, compact disk drives, Blu-ray disk drives, redundant array of independent disks (RAID) systems, and digital versatile disk (DVD) drives.

The machine executable instructions 932 of FIG. 8 may be stored in the mass storage device 928, in the volatile memory 914, in the non-volatile memory 916, and/or on a removable non-transitory computer readable storage medium such as a CD or DVD.

From the foregoing, it will be appreciated that example methods, apparatus and articles of manufacture have been disclosed that allow for phase correction between at least two signals. Additionally, the example methods, apparatus and articles of manufacture that have been disclosed utilize new phase detector circuitry that is symmetric and uses only four transistors. The solution disclosed is greatly reduced in complexity and greatly reduces loading and power consumption. The disclosed methods, apparatus and articles of manufacture improve the efficiency of using a computing device by no longer having to interrupt a process to detect and/or correct signal phase. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A circuit comprising:
   a first transistor having a first control terminal, a first current terminal, and a second current terminal;
   a second transistor having a second control terminal, a third current terminal, and a fourth current terminal, the third current terminal coupled to the first current terminal and the fourth current terminal coupled to the second current terminal;
   a first capacitor coupled between the first control terminal and a first quadrature input;
   a second capacitor coupled between the first control terminal and a first in-phase input;
   a third capacitor coupled between the second control terminal and a second quadrature input; and
   a fourth capacitor coupled between the second control terminal and a second in-phase input.

2. The circuit of claim 1, further comprising:
   a third transistor having a third control terminal, a fifth current terminal, and a sixth current terminal;
   a fourth transistor having a fourth control terminal, a seventh current terminal, and an eighth current terminal, the seventh current terminal coupled to the fifth current terminal and the eighth current terminal coupled to the sixth current terminal;
   a fifth capacitor coupled between the third control terminal and the first quadrature input;
   a sixth capacitor coupled between the third control terminal and the second in-phase input;
   a seventh capacitor coupled between the fourth control terminal and the second quadrature input; and
   an eighth capacitor coupled between the fourth control terminal and the first in-phase input.

3. The circuit of claim 2, wherein the first current terminal is coupled to a first output and the fifth current terminal is coupled to a second output.

4. The circuit of claim 2, wherein the first transistor and the second transistor form a first squaring circuit and the third transistor and the fourth transistor form a second squaring circuit.

5. The circuit of claim 1, wherein the circuit is adapted to be coupled to a lookup table to obtain a biasing input.

6. The circuit of claim 3, further comprising:
a first current source coupled to the second current terminal; and
a second current source coupled to the sixth current terminal.

7. A system comprising:
a comparator having a first comparator input, a second comparator input, a first comparator output, and a second comparator output;
first amplifiers having a first amplifier input and a first amplifier output, the first amplifier input coupled to the first comparator output;
second amplifiers having a second amplifier input and a second amplifier output, the second amplifier input coupled to the second comparator output;
a phase detector having a first phase detector input, a second phase detector input, a first phase detector output, and a second phase detector output, the first phase detector input coupled to the first amplifier output, the second phase detector input coupled to the second amplifier output, the first phase detector output coupled to the first comparator input, and the second phase detector output coupled to the second comparator input.

8. The system of claim 7, wherein the phase detector is configured to:
receive a first signal at the first phase detector input;
receive a second signal at the second phase detector input;
produce a first voltage at the first phase detector output based on the first signal and the second signal; and
produce a second voltage at the second phase detector output based on the first signal and the second signal.

9. The system of claim 8, wherein the phase detector is configured to produce the first voltage based on a phase difference between a first phase of the first signal and a second phase of the second signal and to produce the second voltage based on a phase difference between the first phase of the first signal and the second phase of the second signal.

10. The system of claim 8, wherein the first voltage and the second voltage are out of phase.

11. The system of claim 7, wherein the phase detector is a symmetric phase detector.

12. The system of claim 7, further comprising:
a receiver amplifier having a receiver amplifier output;
a first mixer having a first mixer input, a second mixer input, and a first mixer output, the first mixer input coupled to the first amplifier output and the second mixer input coupled to the receiver amplifier output; and
a second mixer having a third mixer input, a fourth mixer input, and a second mixer output, the third mixer input coupled to the second amplifier output and the second mixer input coupled to the receiver amplifier.

13. The system of claim 12, further comprising:
a first filter having a first filter input coupled to the first mixer output; and
a second filter having a second filter input coupled to the second mixer output.

14. The system of claim 7, further comprising an I/Q generator coupled to the first amplifiers and to the second amplifiers.

15. A method comprising:
generating, by a look up table, a biasing input;
receiving, by a phase detector, using the biasing input, a first signal from an amplifier;
generating, by the phase detector, a first output based on the first signal;
generating, by a comparator, a second output based on the first output; and
adjusting, by the amplifier, a phase response based on the second output.

16. The method of claim 15, further comprising:
receiving, by the phase detector, a second signal from a second amplifier; and
generating, by the comparator, a third output based on the first signal and the second signal, wherein generating the first signal is further based on the second signal.

17. The method of claim 16, wherein the phase response is a first phase response, the method further comprising adjusting, by the second amplifier, a second phase response based on the third output.

18. The method of claim 15, further comprising applying, by the amplifier, a first gain.

19. The method of claim 15, further comprising modifying, by a filter, a first frequency of the first output.

* * * * *